US012633493B2

(12) United States Patent
Zhang et al.

(10) Patent No.: US 12,633,493 B2
(45) Date of Patent: May 19, 2026

(54) ELECTRON GUN CHAMBER FOR SCANNING ELECTRON MICROSCOPE, ELECTRON GUN CONTAINING SAME, AND SCANNING ELECTRON MICROSCOPE

(71) Applicants: NATIONAL INSTITUTE FOR MATERIALS SCIENCE, Tsukuba (JP); Terabase Inc., Okazaki (JP)

(72) Inventors: Han Zhang, Tsukuba (JP); Yasushi Yamauchi, Tsukuba (JP); Yoshihiro Arai, Akishima (JP)

(73) Assignees: National Institute for Materials Science, Ibaraki (JP); Terabase Inc., Aichi (JP)

( * ) Notice: Subject to any disclaimer, the term of this patent is extended or adjusted under 35 U.S.C. 154(b) by 373 days.

(21) Appl. No.: 17/913,815

(22) PCT Filed: Mar. 18, 2021

(86) PCT No.: PCT/JP2021/011177
§ 371 (c)(1),
(2) Date: Sep. 22, 2022

(87) PCT Pub. No.: WO2021/193369
PCT Pub. Date: Sep. 30, 2021

(65) Prior Publication Data
US 2024/0212971 A1 Jun. 27, 2024

(30) Foreign Application Priority Data
Mar. 26, 2020 (JP) ................................. 2020-056741

(51) Int. Cl.
*H01J 37/18* (2006.01)
*H01J 37/073* (2006.01)

(52) U.S. Cl.
CPC ............ *H01J 37/18* (2013.01); *H01J 37/073* (2013.01); *H01J 2237/1825* (2013.01);
(Continued)

(58) Field of Classification Search
CPC .. H01J 37/18; H01J 37/073; H01J 2237/1825; H01J 2237/186; H01J 2237/188; H01J 2237/28
See application file for complete search history.

(56) References Cited

U.S. PATENT DOCUMENTS 7,615,765 B2 * 11/2009 Katagiri .................. H01J 37/28
417/51
2006/0231773 A1 * 10/2006 Katagiri .................. H01J 41/12
250/492.1
(Continued)

FOREIGN PATENT DOCUMENTS

JP S6233157 U * 2/1987
JP H04-98746 A 3/1992
(Continued)

OTHER PUBLICATIONS

English Translation of JP2004110967 (Year: 2004).*
(Continued)

*Primary Examiner* — David E Smith
*Assistant Examiner* — Laura Eloise Tandy
(74) *Attorney, Agent, or Firm* — Morgan, Lewis & Bockius LLP

(57) ABSTRACT

Provided is an electron gun chamber for a scanning electron microscope with (a) an electron source chamber; (b) an intermediate room; (c) an air lock valve installation part; (d) exhaust holes for a preliminary vacuum exhaust pump; and (e) an opening and closing means.

13 Claims, 8 Drawing Sheets

(52) U.S. Cl.
     CPC ... *H01J 2237/186* (2013.01); *H01J 2237/188*
                (2013.01); *H01J 2237/28* (2013.01)

(56) References Cited

U.S. PATENT DOCUMENTS

| | | | | |
|---|---|---|---|---|
| 2008/0067445 A1* | 3/2008 | Kaga | | H01J 37/18 |
| | | | | 250/492.21 |
| 2010/0270299 A1* | 10/2010 | Baltussen | | H01L 21/6719 |
| | | | | 220/681 |
| 2011/0049393 A1* | 3/2011 | De Boer | | H01J 37/16 |
| | | | | 250/492.2 |
| 2012/0138791 A1* | 6/2012 | Mankos | | H01J 37/04 |
| | | | | 250/306 |
| 2015/0170873 A1* | 6/2015 | Miyazaki | | H01J 37/20 |
| | | | | 250/442.11 |

FOREIGN PATENT DOCUMENTS

| | | | | |
|---|---|---|---|---|
| JP | 2002-516018 A | | 5/2002 | |
| JP | 2002-541623 A1 | | 12/2002 | |
| JP | 2004110967 A | * | 4/2004 | ............... G21K 5/04 |
| JP | 2011-034744 A | | 2/2011 | |
| WO | 97/07525 A1 | | 2/1997 | |
| WO | 98/34266 A1 | | 8/1998 | |

OTHER PUBLICATIONS

English translation of JP 2004110967 A (Year: 2004).*

English translation of JP S6233157 U (Year: 1987).*

Konno et al., "Lattice imaging at an accelerating voltage of 30 kV using an in lens type cold field emission scanning electron microscope" Hitachi High Technol Corp, 882 Ichige, Hitachinaka, Ibaraki 3128504, Japan Ultramicroscopy vol. 145 pp. 28 35 DOI: 10.1016/j.ultramic.2013.09.001, Published on: Oct. 2014 (Abstract).

Hermann et al., "Progress in Scanning Electron Microscopy of Frozen Hydrated Biological Specimens", Scanning Microscopy vol. Issue 7, 1 pp. 343 350, Published on: Mar. 1993 (Abstract).

International Search Report (with partial translation) dated May 18, 2021, issued in corresponding International Patent Application No. PCT/JP2021/11177.

Extended European Search Report issued in European Patent Application No. 21776840.7 dated Oct. 29, 2024.

* cited by examiner

FRONT VIEW          SIDE VIEW

FRONT VIEW          SIDE VIEW

| | |
|---|---|
| 12 | Lid body |
| 13 | Piston |
| 14 | Cylindrical concave |

OPENED          CLOSED

OPENED          CLOSED

OPENED          SHIELDING PLATE          CLOSED

OPENED    SHIELDING PLATE    CLOSED

OPENED    SHIELDING PLATE    CLOSED

ELECTRON GUN CHAMBER FOR SCANNING ELECTRON MICROSCOPE, ELECTRON GUN CONTAINING SAME, AND SCANNING ELECTRON MICROSCOPE

TECHNICAL FIELD

The present invention relates to a field-emission electron gun chamber for a scanning electron microscope, and an electron gun and a scanning electron microscope, which include the electron gun chamber.

The above electron gun chamber particularly relates to one that may have a substantially cubic shape.

The above scanning electronic microscope particularly relates to one that may be used at a low acceleration voltage (specifically, a maximum acceleration voltage of 15 kV).

In the present application, the above "field emission" may be simply referred to as "FE" as an abbreviation for "field emission" or "field emission". In addition, in the present application, the "substantially cubic shape" may be referred to as "cubic".

BACKGROUND ART

Electron microscopes are broadly classified into transmission electron microscopes (TEM) in which an electron beam passes through a sample to obtain a magnified image of the sample, and scanning electron microscopes (SEM) in which the sample surface is scanned with an electron beam having an extremely small diameter (namely, probe size), secondary electrons generated from the irradiation position of the electron beam (, which may be referred to as "electron beam" in the present application) are detected, and an image is displayed on a monitor by this signal.

As the energy of electron beams, in transmission electron microscopes, the electron beam passes through the sample and thus a high acceleration voltage (specifically, an acceleration voltage of 100 kV to 1000 kV) is used as the acceleration voltage of the electron beam.

In scanning electron microscopes, the sample surface is scanned and thus a high acceleration voltage of 100 kV to 500 kV is used as the acceleration voltage of the electron beam in some cases (for example, Patent Literatures 1 and 2) but a low acceleration voltage (specifically, an acceleration voltage of 10 kV to 30 kV), which is lower than that of a transmission electron microscope, is generally used as the acceleration voltage of the electron beam. In fact, Non-Patent Literatures 1 and 2 disclose scanning electron microscopes adopting an acceleration voltage of 30 kV. As scanning electron microscopes, those adopting a maximum acceleration voltage of 15 kV among the above low acceleration voltages are widely and generally used.

As electron sources (namely, electron sources for generating and accelerating electron beams) in scanning electron microscopes, for example, there are a thermoelectron source that extracts electrons by heating tungsten filaments or lanthanum hexaboride ($LaB_6$) nanowires provided at the tip (, which may be referred to as "emitter" in the present application) of the cathode electrode in a vacuum chamber, and a field-emission electron source (, which may be referred to as "field-emission electron source" in the present application) that extracts electrons by field emission that operates by applying a high electric field to the needle tip of tungsten single crystal in a high vacuum (specifically, $10^{-7}$ Pa or more).

Among the electron sources, the field-emission electron source is a high-performance electron source having high resolution in that the size of electron beam is smaller and the electron energy less fluctuates generally than those of the thermoelectron source, but is greatly expensive. Therefore, at present, the products commercialized as scanning electron microscopes using a field-emission electron source as the electron source are limited to high-grade scanning electron microscopes adopting a maximum acceleration voltage of 30 kV that is the highest acceleration voltage among the above low acceleration voltages as far as the applicants know.

CITATION LIST

Patent Literature

PATENT LITERATURE 1: JP 2002-541623 A
PATENT LITERATURE 2: JP 2002-516018 A

Non-Patent Literature

NON-PATENT LITERATURE 1: Konno et al., "Lattice imaging at an accelerating voltage of 30 kV using an in-lens type cold field-emission scanning electron microscope" Hitachi High Technol Corp, 882 Ichige, Hitachinaka, Ibaraki 3128504, Japan ULTRAMICROSCOPY Volume: 145 Pages: 28-35 DOI: 10.1016/j.ultramic.2013.09.001, Published on: October 2014 (Abstract)

NON-PATENT LITERATURE 2: HERMANN, R, MULLER, M., "PROGRESS IN SCANNING ELECTRON-MICROSCOPY OF FROZEN-HYDRATED BIOLOGICAL SPECIMENS", SCANNING MICROSCOPY Volume: Issue 7, 1 Pages: 343-350, Published on: March 1993 (Abstract)

SUMMARY OF INVENTION

Technical Problem

Meanwhile, in recent years, in scanning electron microscopes adopting a maximum acceleration voltage of 15 kV, which are widely and generally used as a scanning electron microscope as well, it is desired to use a high-performance field-emission electron source as the electron source, and its studies and research and development have been carried out.

However, when the technology used in conventional scanning electron microscopes using field-emission electron sources (namely, existing scanning electron microscopes, which adopt a maximum acceleration voltage of 30 kV and use field-emission electron sources) is applied to scanning electron microscopes adopting a maximum acceleration voltage of 15 kV as it is, this causes the following various problems: the structures to achieve a high vacuum required to use field-emission electron sources, specifically the structures of the vacuum container (, which may be referred to as "field-emission electron gun chamber" or "field-emission electron gun chamber" in the present application) housing the part (, which may be referred to as "field-emission electron gun" in the present application) which generates and accelerates the electron beam from the field-emission electron source, and the structure of its vacuum exhaust system part becomes complicated and large; and the manufacturing cost is greatly high. This point will be described in detail below with reference to FIGS. 1 and 2.

FIGS. 1 and 2 relate to an existing scanning electron microscope which uses a field-emission electron source and adopts a maximum acceleration voltage of 30 kV, and illustrate an extremal view and a cross-sectional view (namely, schematic view) of a general field-emission electron gun chamber and its vacuum exhaust system constituting the scanning electron microscope, respectively.

As illustrated in FIGS. 1 and 2, an intermediate chamber 1 is adjacent to the bottom face of an electron source chamber 2, and an airlock valve 3 is installed in the intermediate chamber 1. The electron source chamber 2 is a vacuum container (namely, chamber) for loading a field-emission electron source.

An ion pump 4 for exhausting the electron source chamber is installed outside the electron source chamber 2 via a pipe in order to vacuum-exhaust the inside of the chamber, and an ion pump 4 for exhausting the intermediate chamber is installed outside the intermediate chamber 1 via a pipe in order to vacuum-exhaust the inside of the intermediate chamber 1. A pipe provided with a roughing valve 6 is further linked to the pipe linking the electron source chamber 2 and the ion pump 4 for exhausting the electron source chamber, a pipe provided with another roughing valve 6 is further linked to the pipe linking the intermediate chamber 1 and the ion pump 4 for exhausting the intermediate chamber, each of the pipes provided with the roughing valve 6 is connected to a pipe for vacuum exhaust 5. In the present application, the roughing valve 6 may be referred to as a "preliminary exhaust valve 6" or simply a "preliminary exhaust valve".

Here, a field-emission electron source chamber 8 is the part that generates and accelerates an electron beam from the field-emission electron source as described above. When used as a scanning electron microscope, an electron microscope lens-barrel 7 (namely, a cylindrical portion, which includes a lens for a scanning electron microscope generally called a "focusing lens" or an "objective lens" and is loaded and installed in a scanning electron microscope) is installed as illustrated in FIG. 2. In other words, the field-emission electron source chamber 8 may be rephrased as a general term for the part to be placed on the electron microscope lens-barrel 7. Specifically, according to FIGS. 1 and/or 2, the field-emission electron source chamber 8 is the part composed of the electron source chamber 2, the intermediate chamber 1, the airlock valve 3, and the roughing valves 6 (namely, the roughing valve 6 provided to the pipe linked to the pipe linking the electron source chamber 2 and the ion pump 4 for exhausting the electron source chamber and the roughing valve 6 provided to the pipe linked to the pipe linking the intermediate chamber 1 and the ion pump 4 for exhausting the intermediate chamber). Therefore, the structure of the field-emission electron gun chamber 8 is complicated and large.

Incidentally, the field-emission electron source chamber 8 and the electron microscope lens-barrel 7 have a structure that allows them to be attached to and detached from each other.

On the other hand, a vacuum exhaust system 9 is an exhaust system part required to achieve a high vacuum required to operate the field-emission electron source, and the vacuum exhaust system 9 is externally attached to the field-emission electron source chamber 8. Specifically, according to FIGS. 1 and/or 2, the vacuum exhaust system 9 is the part composed of the ion pump 4 for exhausting the electron source chamber, which is installed in the electron source chamber 2 via a pipe and the ion pump 4 for exhausting the intermediate chamber, which is installed in the intermediate chamber 1 via a pipe, and the pipe for vacuum exhaust 5 connected to each roughing valve 6. The pipe for vacuum exhaust 5 is linked to a diffusion pump (, which is also referred to as an "oil diffusion pump" and is a pump that evacuates by repeating the cycle in which the gas particles existing around hot oil are repelled by spraying the hot oil from the lower region in the form of a jet and then the oil liquefies and falls down when coming into contact with a water-cooled wall, and may be referred to simply as "DP" in the present application.) and/or a turbomolecular pump (, which is a pump of which the wings rotate at a high speed to exhaust gas by scraping gas molecules, and may be referred to simply as "TMP" in the present application) (DP and TMP are not illustrated in either FIG. 1 or 2). These pumps (namely, DP and TMP) are further linked to a rotary pump (this is a type of vacuum pump that exhausts gas so that its rotating internal blades bail out gas, and may be referred to simply as "RP" in the present application) (RP is not illustrated in either FIG. 1 or 2). The rotary pump is used for primary vacuuming, and the diffusion pump and turbomolecular pump are used for secondary vacuuming. In the present application, these vacuuming may be referred to as "rough pumping". In the present application, the vacuum generated by rough pumping (namely, primary vacuuming and secondary vacuuming) may be referred to as "rough vacuum".

As the ion pump 4 for exhausting the electron source chamber and the ion pump 4 for exhausting the intermediate chamber, a sputter ion pump (, which is a pump that vacuum-exhausts the chamber by adsorbing gas molecules on an active metal surface, and may be referred to simply as "SIP" in the present application) is used. These ion pumps 4 are used to achieve a higher degree of vacuum (specifically, $10^{-7}$ Pa order), after rough exhausting is performed using the diffusion pump or turbomolecular pump until the degree of vacuum reaches the operable degree of vacuum (specifically, $10^{-4}$ Pa order). This is because of the following reasons: field-emission electron sources have the advantages of having a superior luminance (namely, brightness, which means that the amount of electrons per unit solid angle is large) and affording a higher resolution image compared to thermoelectron sources such as tungsten electron sources and lanthanum hexaboride ($LaB_6$) electron sources, but the degree of vacuum of the electron source chamber 2 demanded to use field-emission electron sources is $10^{-7}$ Pa order, which is a degree of vacuum higher than those of tungsten electron sources and $LaB_6$ electron sources by two orders of magnitude or more.

In addition, when used with a scanning electron microscope, the electron microscope lens-barrel 7 is installed to the field-emission electron gun chamber 8, but the degree of vacuum in the electron microscope lens-barrel 7 during operation is $10^{-3}$ Pa order.

A difference in the degree of vacuum of 3 to 4 orders of magnitude is caused between the degree of vacuum of $10^{-7}$ Pa order in the electron source chamber 2 and the degree of vacuum of $10^{-3}$ Pa order in the electron microscope lens-barrel 7, thus the intermediate chamber 1, which is a small space, is provided between the two, and the insides of the electron source chamber 2, the intermediate chamber 1, and the electron microscope lens-barrel 7 are individually vacuum-exhausted so that the difference in the degree of vacuum between the vacuum chambers individually continue is 2 orders of magnitude or less (specifically, the difference in the degree of vacuum between the electron source chamber 2 and the intermediate chamber 1 is 2 orders of magnitude or less and the difference in the degree of vacuum between the intermediate chamber 1 and the electron microscope lens-barrel 7 is 2 orders of magnitude or less). As described above, the vacuum exhaust system 9 is used to exhaust the electron source chamber 2 and the intermediate chamber 1.

As illustrated in FIG. 2, the structure is such that a hole called a small throttle (, which may be referred to as a "throttle for differential exhaust" in the present application) having a diameter (Φ) of 0.5 to 1 mm is provided between the vacuum chambers (namely, on the partition face between the electron source chamber 2 and the intermediate chamber 1 and the partition face between the intermediate chamber 1 and the electron microscope lens-barrel 7) and the electron beam passes through this small throttle (specifically, hole) and is guided to the lower electron microscope lens-barrel 7 in the lower region while the difference in the degree of vacuum of the continuous vacuum chambers is maintained as described above. In the present application, the "partition face" may be referred to as an "adjacent face". In addition, the structure is such that each vacuum chamber is vacuum-isolated by providing a valve (namely, the airlock valve 3) for vacuum-isolating the vacuum at each part of the electron source chamber 2 and the intermediate chamber 1 from the vacuum in the electron microscope lens-barrel 7 to the hole (namely, the throttling hole) on the partition face between the intermediate chamber 1 and the electron microscope lens-barrel 7 and the electron beam passes by opening the valve only when an image is observed.

For the reasons described above, in the conventional scanning electron microscopes using the field-emission electron sources, complicated and large field-emission electron gun chamber 8 and vacuum exhaust system 9 are demanded as a structure to achieve the high vacuum required to use a field-emission electron source (specifically, the structure of the field-emission electron gun chamber and its vacuum exhaust system).

Moreover, the field-emission electron gun chamber 8 is usually made of stainless steel to meet the demand for use in a high vacuum. Therefore, for the pipe and flange parts illustrated in FIG. 1, stainless steel pipes and stainless steel flanges should generally be connected by welding (for example, arc welding). Moreover, in order to reduce the surface area, the surface of the field-emission electron gun chamber 8 is usually subjected to a composite electrolytic polishing treatment to be finished as a mirror face. As a result, the structure of the field-emission electron gun chamber 8 and its vacuum exhaust system 9 is complicated, and the manufacturing cost becomes high.

In order to obtain a high vacuum, baking (baking) at a high temperature of about 200° C. is usually performed for several hours to several days in order to discharge the moisture contained in the stainless steel metal. Hence, the field-emission electron gun chamber 8 should have a heat-resistant structure so that all parts including the valve can withstand a baking temperature of 200° C. Therefore, an inexpensive rubber O-ring cannot be used for the flange joints of the vacuum chamber (specifically, the electron source chamber 2 and the intermediate chamber 1 in FIG. 1) and the sputter ion pump (specifically, the ion pump 4 for exhausting the electron source chamber and the ion pump 4 for exhausting the intermediate chamber in FIG. 1), and ConFlat vacuum flanges (namely, ICF) using expensive copper gaskets are usually adopted.

For the reasons described above, it is not desirable to apply the technology used in existing scanning electron microscopes, which adopt a maximum acceleration voltage of 30 kV and use field-emission electron sources to scanning electron microscopes adopting a maximum acceleration voltage of 15 kV as it is, because various problems are caused that the structure to achieve a high vacuum required to use field-emission electron sources (specifically, the structure of the field-emission electron gun chamber and its vacuum exhaust system) becomes complicated and large, and this results in greatly high manufacturing cost. Therefore, it is difficult to develop a product of a scanning electron microscope which uses a field-emission electron source and adopts a maximum acceleration voltage of 15 kV, and no product has been commercialized yet.

In view of such a situation, it is an object of the invention of the present application to provide a field-emission electron gun chamber for a scanning electron microscope, the gun chamber having an unprecedented structure that is simple and can be miniaturized as well as being capable of using a field-emission electron source as the electron source and maintaining 15 kV as the maximum acceleration voltage of an electron beam from the electron source. As a result, it is an object of the invention of the present application to provide the field-emission electron gun chamber, which is thus excellent in terms of manufacturing cost as well.

Also, it is an object of the invention of the present application to provide an electron gun and a scanning electron microscope, which include the above field-emission electron gun chamber, thereby reducing the manufacturing cost of the electron gun and the scanning electron microscope.

Incidentally, regarding the conventional scanning electron microscopes using field-emission electron sources, the process for obtaining a high vacuum is also described below for reference.

As illustrated in FIGS. 1 and 2, the sputter ion pumps (namely, the ion pump 4 for exhausting the electron source chamber and the ion pump 4 for exhausting the intermediate chamber) are closed (namely, off), the two roughing valves 6 (namely, the roughing valve 6 provided to the pipe linked to the pipe linking the electron source chamber 2 and the ion pump 4 for exhausting the electron source chamber and the roughing valve 6 provided to the pipe linked to the pipe linking the intermediate chamber 1 and the ion pump 4 for exhausting the intermediate chamber) and the airlock valve 3 are opened (namely, on), and vacuum exhaust (namely, primary vacuuming) from the atmospheric pressure is performed using a rotary pump (not illustrated in either FIG. 1 or 2). After that, as the main pumping (namely, secondary vacuuming), vacuum exhaust is performed to about 104 Pa order using a diffusion pump or a turbomolecular pump. As the next step, baking to hold the electron source portion installed in the electron source chamber 2 at 150° C. to 200° C. is performed by using a heating heater. The baking time is usually several days. After termination of baking, the two roughing valves 6 and the airlock valve 3 are closed (namely, off), the sputter ion pumps (namely, the ion pump 4 for exhausting the electron source chamber and the ion pump 4 for exhausting the intermediate chamber) are opened (namely, on), and vacuum exhaust of the high vacuum region is performed to obtain the desired high vacuum.

The field-emission electron gun chamber 8 is provided with the airlock valve 3 to block the vacuum at the part of the electron source chamber 2 and intermediate chamber 1 from the vacuum in the electron microscope lens-barrel 7. This valve is closed to avoid a decrease in the degree of vacuum in the electron source chamber 2 when the electron source is attached to the electron source chamber 2 or when the observation sample is exchanged during normal observation. On the other hand, this valve is opened when the electron beam passes again after the vacuum in the electron microscope lens-barrel 7 is improved.

Solution to Problem

As a result of diligent research, the inventors of the present application have found out that the above-mentioned problems can be solved by changing the conventional installation means of the preliminary exhaust valves installed in the electron source chamber and intermediate chamber constituting the field-emission electron gun chamber for a scanning electron microscope to a new means and/or changing the conventional installation means and structure of an airlock valve to a new means, and have completed the invention of the present application.

Specifically, the invention of the present application has the following configurations.

[1] An electron gun chamber for a scanning electron microscope, the chamber comprising:

(a) an electron source chamber including a site to which a field-emission electron source is detachably attached;

(b) an intermediate chamber, which is provided adjacent to the electron source chamber and through which an electron beam passes in a direction of an electron beam emitted from the electron source installed at the site;

(c) an airlock valve installation portion provided in the intermediate chamber;

(d) an exhaust hole for a pump for preliminary vacuum exhaust, which is provided on each of continuous faces of the electron source chamber and the intermediate chamber: and (e) an opening and closing means, which is included in the electron source chamber and the intermediate chamber and directly opens and closes the exhaust hole for a pump for preliminary vacuum exhaust.

[2] The electron gun chamber according to [1], wherein the electron gun chamber has a substantially cubic shape.

[3] The electron gun chamber according to [1] or [2], wherein the electron source chamber and the intermediate chamber are fabricated only by hole drilling of the same stainless steel block, which does not require welding.

[4] The electron gun chamber according to any one of [1] to [3], wherein the opening and closing means has a configuration in which a lid body interlocked with sliding of a piston is pressed and released to open and close each of the exhaust holes of the electron source chamber and the intermediate chamber.

[5] The electron gun chamber according to [4], wherein the exhaust hole of the electron source chamber is placed on a bottom face of a cylindrical concave provided on a side face of the electron source chamber, wherein the concave is fitted into the lid body that opens and closes the exhaust hole of the electron source chamber, and the exhaust hole of the intermediate chamber is placed on a bottom face of a cylindrical concave provided on a side face of the intermediate chamber, wherein the concave is fitted into the lid body that opens and closes the exhaust hole of the intermediate chamber.

[6] The electron gun chamber according to [4], wherein the lid body that opens and closes the exhaust hole of the electron source chamber and the lid body that opens and closes the exhaust hole of the intermediate chamber are the same one lid body.

[7] The electron gun chamber according to [6], wherein both the exhaust holes of the electron source chamber and the intermediate chamber continue from the electron source chamber and the intermediate chamber and are placed on a bottom face of one cylindrical concave provided on a side face straddling the electron source chamber and the intermediate chamber, and wherein the concave is fitted into the lid body.

[8] The electron gun chamber according to any one of [1] to [7], wherein each of the electron source chamber and the intermediate chamber comprises an exhaust hole for a pump for high vacuum exhaust, the pump for high vacuum exhaust performing exhaust to a degree of vacuum at which a field-emission electron source operates.

[9] The electron gun chamber according to [8], wherein the exhaust holes for a pump for high vacuum exhaust of the electron source chamber and the intermediate chamber are placed at positions at which the exhaust holes are symmetrical to each other.

[10] An electron gun chamber for a scanning electron microscope having a substantially cubic shape, the electron gun chamber comprising:

(a) an electron source chamber including a site to which a field-emission electron source is detachably attached;

(b) a first intermediate chamber provided adjacent to the electron source chamber and a second intermediate chamber adjacent to a lower region of the first intermediate chamber, through which an electron beam passes below the electron source in a direction of an electron beam emitted from the electron source installed at the site: and (c') an airlock valve installed in the second intermediate chamber, wherein the airlock valve is equipped with:

(i) an O-ring installation face having an inclination axis of 60° or more and 80° or less with respect to an adjacent face of the first intermediate chamber and the second intermediate chamber, and (ii) a substantially cylindrical convex portion extending upward in a direction perpendicular to the inclination axis on the O-ring installation face, wherein the convex portion comprises a means for passing and blocking the electron beam.

[11] The electron gun chamber according to [10], wherein the means for passing an electron beam has a configuration in which an electron beam passes through a through hole of the convex portion provided in a direction of the electron beam passing through the second intermediate chamber, and the means for blocking an electron beam has a configuration in which the convex portion is slid in a direction perpendicular to the inclination axis to shift the through hole and block passage of an electron beam.

[12] The electron gun chamber according to [10] or [11], wherein the airlock valve includes a means for shielding an electron beam at a site exposed to the electron beam of the O-ring installation face.

[13] An electron gun for a scanning electron microscope, comprising the electron gun chamber according to any one of [1] to [12].

[14] A scanning electron microscope comprising the electron gun chamber according to any one of [1] to [12].

Advantageous Effects of Invention

According to the invention of the present application, the effects described below can be provided, and thus a field-emission electron gun chamber for a scanning electron microscope can be provided which has an unprecedented structure that is simple and can be miniatunzed as well as being capable of using a field-emission electron source as the electron source and maintaining 15 kV as the maximum acceleration voltage of an electron beam from the electron source. As a result, the field-emission electron gun chamber which is excellent in terms of manufacturing cost can also be provided.

According to the invention of the present application, the manufacturing cost of an electron gun and a scanning electron microscope by providing an electron gun and a scanning electron microscope, which include the above field-emission electron gun chamber can be reduced.

Specifically, the effects provided by the invention of the present application are as follows.

1. According to the invention of the present application, an effect of having an unprecedented structure that is simple and can be miniaturized can be provided.

According to the invention of the present application, the easy fabrication of an electron source chamber, an intermediate chamber, an airlock valve, and a preliminary exhaust valve, which constitute the field-emission electron gun chamber can be performed by machining of a small and substantially cubic shape (for example, substantially 70 mm cubic stainless steel block) without performing complicated welding work. Therefore, the structure is unprecedented and is a remarkably small and compact structure compared to the structure in which a flange is welded to a pipe (specifically, a pipe for vacuum exhaust) that is indispensable in a conventional scanning electron microscope using a field-emission electron source. Hence, according to the invention of the present application, the above effect can be provided. As a result, an effect of being excellent in terms of manufacturing cost can also be provided.

This point will be described in detail as follows: in the structure of the field-emission electron gun chamber and its vacuum exhaust system in a conventional scanning electron microscope using a field-emission electron source, the flange and the pipe are required to be welded together, but the field-emission electron gun chamber of the invention of the present application can be easily fabricated by drilling a small and substantially cubic stainless steel block (namely, lump) without performing welding work. As a result, an exceedingly small, compact and rational structure can be obtained. Moreover, since the structure is a block structure, a cartridge heater can be attached in the block and used instead of a heater that heats an electron source by a band-shaped heater wrapped around the electron source and an expensive dedicated heater that completely surrounds an electron source as a heating heater for baking, and the heating efficiency can be thus improved. For example, since the field-emission electron gun chamber of the invention of the present application has a metal block structure as described above, machining a hole (for example, a hole having a diameter ($\Phi$) of about 8 mm and a length (L) of about 50 mm) in this block and embedding an inexpensive sheath heater in the hole for use can be done. Since the above structure is a small integrated structure without any welded place, the efficient and sufficient heating can be provided using such an embedded heater.

2. According to the invention of the present application, an effect that the field-emission electron gun chamber can be used as a field-emission electron gun chamber for a scanning electron microscope which uses a field-emission electron source as the electron source and adopts a maximum acceleration voltage of 15 kV can be provided.

According to the invention of the present application, as described above, a field-emission electron gun chamber including all the preliminary exhaust valve, pipe for vacuum exhaust, and airlock valve which constitute the field-emission electron gun chamber and its vacuum exhaust system in a conventional scanning electron microscope using a field-emission electron source can be provided by machining of a small and substantially cubic shape (for example, a substantially 70 mm cubic stainless steel block), and thus this chamber as it is can be used as a field-emission electron gun chamber for a scanning electron microscope which uses a field-emission electron source as the electron source and adopts a maximum acceleration voltage of 15 kV. Hence, according to the invention of the present application, the above effect can be provided.

3. According to the invention of the present application, an effect of eliminating the need for an expensive commercially available external preliminary exhaust valve can be provided.

According to the invention of the present application, achieved is a compact design that allows an expensive commercially available external preliminary exhaust valve (specifically, the roughing valve 6 in FIGS. 1 and 2) used in a conventional scanning electron microscope using a field-emission electron source also to be accommodated inside the main body together with the airlock valve (airlock valve 3 in FIGS. 1 and 2), and thus it is not required to attach the preliminary exhaust valve. Hence, according to the invention of the present application, the above effect can be provided. As a result, an effect of being excellent in terms of manufacturing cost can also be provided.

4. According to the invention of the present application, an effect of simplifying the operation and design can be provided.

According to the invention of the present application, the preliminary exhaust valve (specifically, the roughing valve 6 in FIGS. 1 and 2) used in a conventional scanning electron microscope using a field-emission electron source can be opened and closed by one valve structure, and thus the operation and design are simplified. Hence, according to the invention of the present application, the above effect can be provided.

5. According to the invention of the present application, an effect that an inexpensive polyimide sheet can be used as a seal for the preliminary exhaust valve can be provided.

6. According to the invention of the present application, an effect that the reliability as a scanning electron microscope can be improved and the vacuum exhaust load can be reduced can be provided.

According to the invention of the present application, by driving the airlock valve that opens and closes the inclined face so that the face pressure at the time of closing is perpendicular to the installation face of the O-ring (, which may be referred to as "O-ring face" hereinafter), the driving force is directly applied to the O-ring face to be sealed. Therefore, the sealing property is improved, and the reliability as a scanning electron microscope is improved as compared to a conventional scanning electron microscope using a field-emission electron source. Hence, according to the invention of the present application, the above effect can be provided.

At that time, as the structure of the airlock valve is such that the inner side of the O-ring of the O-ring face of the airlock valve that opens and closes the inclined face is a concave hole and a cylindrical convex portion is provided so as to be put in the concave hole (see FIGS. 5, 6A and 6B), the irradiation of the O-ring surface with an electron beam can be avoided.

Further, in the airlock valve that opens and closes the inclined face, as the convex portion is provided with an opening and closing type shielding plate for shielding the electron beam from the part exposed to the electron beam on the O-ring face to be sealed (see FIGS. 6A and 6B), the O-ring surface can be completely hidden from the electron beam path, and this makes it possible to completely avoid irradiation of the O ring surface with an electron beam.

As described above, although the airlock valve in the invention of the present application has a simple structure, the irradiation of the O-ring with an electron beam and exposure of the O-ring to the beam path can be avoided. Further, since the airlock valve can be provided outside the intermediate chamber (for example, intermediate chamber 1 according to FIGS. 5, 6A and 6B), the vacuum exhaust load can be reduced, for example. Hence, according to the invention of the present application, the above effect can be provided.

The drive unit of the airlock valve in the invention of the present application can be installed outside the intermediate chamber (see intermediate chamber 1 according to FIGS. 5, 6A and 6B), and thus a sliding seal can be adopted by an O-ring. Considering that the conventional method requires an expensive vacuum bellows (for example, a welded bellows or a molded bellows) for the vacuum seal of the moving portion of the drive shaft of the airlock valve, this results in large cost reduction, and thus the excellent manufacturing cost can be provided.

7. According to the invention of the present application, an effect that the electron gun chamber for a scanning electron microscope can be used as a high acceleration voltage field-emission electron gun chamber for a scanning electron microscope using a field-emission electron source as the electron source can be provided.

Specifically, according to the invention of the present application, the electron gun chamber for a scanning electron microscope can be used, as a field-emission electron gun chamber for a scanning electron microscope using a field-emission electron source as the electron source, even at an acceleration having a maximum acceleration voltage of 15 kV or more (for example, a high acceleration voltage of 30 to 60 kV).

In the invention of the present application, when considering a field-emission electron gun chamber for a scanning electron microscope, the field-emission electron gun chamber for a scanning electron microscope using a field-emission electron source and adopting a high acceleration voltage of 30 to 60 kV with a maximum acceleration voltage of 15 kV or more, the high-voltage insulator is larger than that when the maximum acceleration voltage is 15 kV, and thus does not enter the field-emission electron gun chamber for a scanning electron microscope adopting a maximum acceleration voltage of 15 kV, which is fabricated by machining of a small and substantially cubic shape (for example, a substantially 70 mm cubic stainless steel block). In such a case, this problem can be solved by connecting a stainless steel cylindrical electron source chamber to the upper part of the field-emission electron gun chamber having a substantially cubic shape (cubic) of the invention of the present application and equipping a large sputter ion pump (SIP). Also, the preliminary exhaust valve, pipe for vacuum exhaust, and airlock valve function as they are, and thus are not required to be changed. The sputter ion pump (SIP) for exhausting the vacuum chamber of the ConFlat vacuum flange (for example, standard size: ICF70) on the side face to a high vacuum replaces the large sputter ion pump (SIP) attached to the upper cylindrical electron source chamber, and the large sputter ion pump is not required any longer. Therefore, according to the invention of the present application, even when a field-emission electron gun chamber for a scanning electron microscope adopting a high acceleration voltage is fabricated, field-emission electron gun chamber can be easily fabricated. Hence, according to the invention of the present application, the above effect can be provided.

In this way, in the invention of the present application, the electron gun chamber for a scanning electron microscope can also be adopted as a high acceleration voltage field-emission electron gun chamber by combining a vacuum chamber having a size adapted to a high acceleration voltage in the upward direction of a substantially cubic (, what is also called as "cubic" in the present application) field-emission electron gun chamber including a preliminary exhaust valve, a pipe for vacuum exhaust, and an airlock valve. In this case, it is required to increase the size of the sputter ion pump (SIP) depending on the size of the chamber, but the extremal preliminary exhaust valve and pipe required for the conventional field-emission electron gun chamber can be eliminated, thereby resulting in a compact and neat shape. Since the structure is simplified in this way, an effect of facilitating the design of external structures such as a bake heater for baking and a magnetic shield can be obtained.

8. According to the invention of the present application, as described above, a field-emission electron gun chamber having an unprecedented structure that is simple and can be miniaturized at low cost can be provided, and thus an effect of reducing the manufacturing cost of an electron gun and a scanning electron microscope can be provided.

BRIEF DESCRIPTION OF DRAWINGS

FIG. 7B is a graph illustrating the relation between the respective pressures (unit: Pa) of the pressure ($P_0$) in an electron source chamber, the pressure ($P_1$) in an intermediate chamber, and the pressure ($P_2$) in a sample chamber and the elapsed time (unit: hr (namely, hour)) during operation of a scanning electron microscope (namely, FIG. 7A) according to an embodiment of the invention of the present application.

FIG. 8 is a graph illustrating the total emission profile of a field-emission electron source using $LaB_6$ as an emitter under the following conditions (conditions: pressure in electron source chamber ($P_0$)=2.5×10$^{-7}$ Pa, pressure in intermediate chamber ($P_1$)=1×10$^{-5}$ Pa, pressure in sample chamber ($P_2$)=3×10$^{-3}$ Pa, and airlock valve is in the open state).

DESCRIPTION OF EMBODIMENTS

Figure 3A:
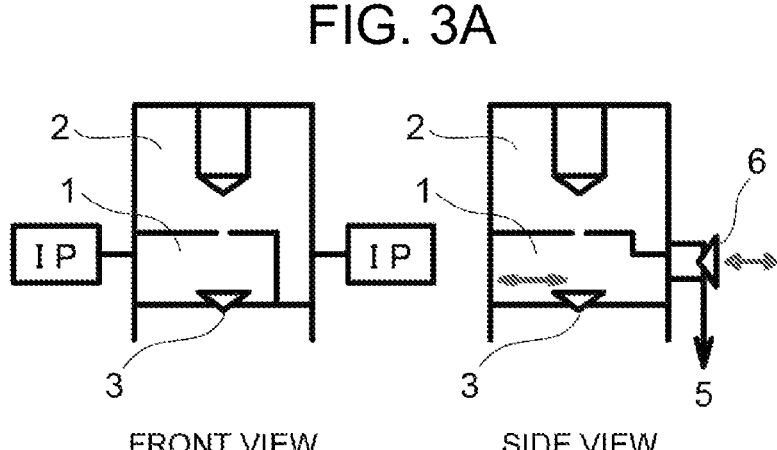
FIG. 3A is a front view and a side view (specifically, both of which are schematic views) of an embodiment of the invention of the present application.
Figure 3B:
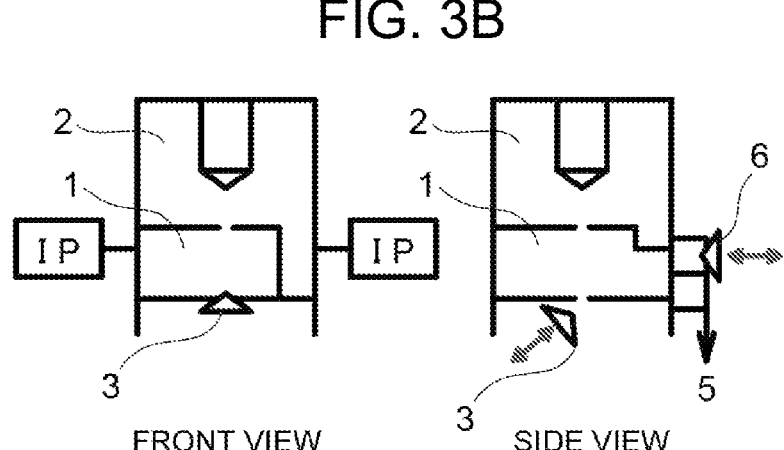
FIG. 3B is a front view and a side view (specifically, both of which are schematic views) of an embodiment of the invention of the present application.
Figure 3C:
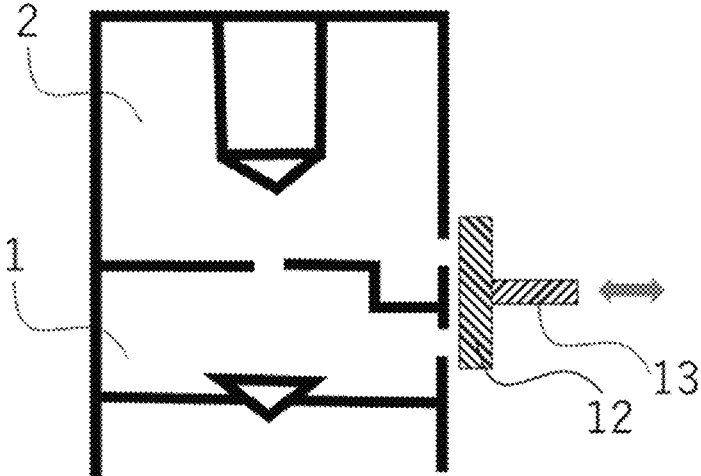
FIGS. 3C and 3D show exemplary electron gun chambers.
Figure 3D:
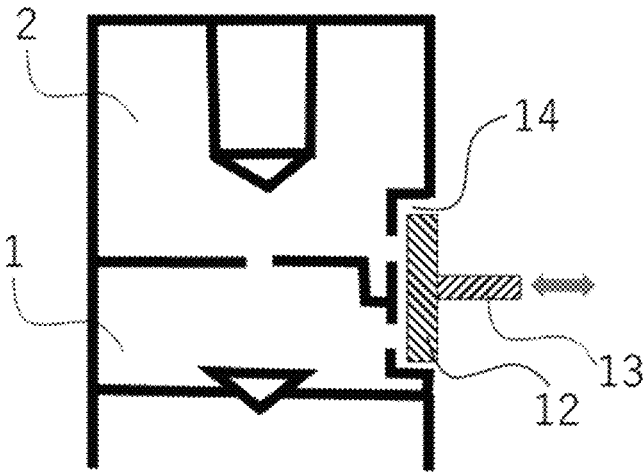
Figure 4A:
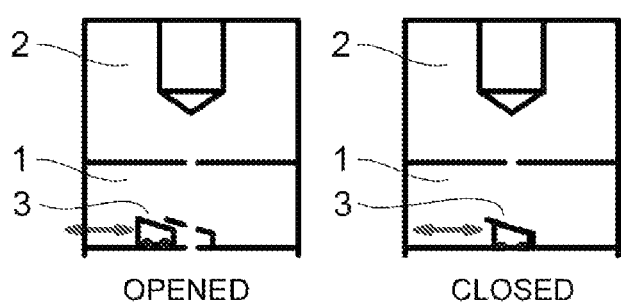
FIG. 4A is a schematic view of an airlock valve installed in a general field-emission electron gun chamber (specifically, the valve having an O-ring installation face horizontal to the driving direction) when opened and closed.
Figure 4B:
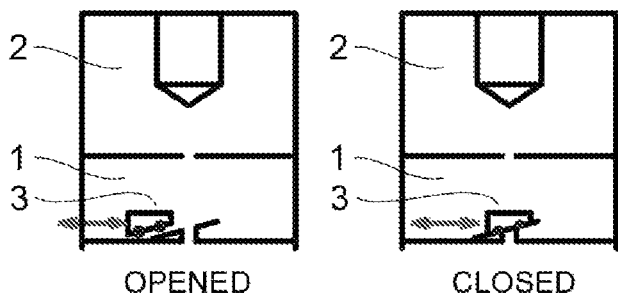
FIG. 4B is a schematic view of an airlock valve installed in a general field-emission electron gun chamber (specifically, the valve having an O-ring installation face inclined with respect to the driving direction by 5° to 15°) when opened and closed.
Figure 5:
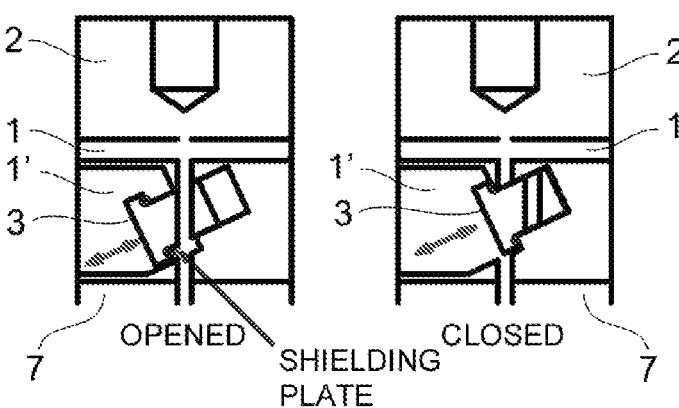
FIG. 5 is a schematic view of an airlock valve with shielding plate installed in a field-emission electron gun chamber according to an embodiment of the invention of the present application when opened and closed.

Hereinafter, the embodiments to carry out the invention of the present application will be described in detail. It should be noted that the invention of the present application is not limited to the following embodiments, and can be carried out by being variously modified within the gist thereof. In FIGS. 4A and 4B and FIG. 5, the vacuum exhaust system (for example, the ion pump for high vacuum exhaust of the electron source chamber and the ion pump for high vacuum exhaust of the intermediate chamber, which are illustrated in FIGS. 3A and 3B) installed in the field-emission electron gun chamber is not illustrated for convenience.

In the invention of the present application, the "electron gun chamber for a scanning electron microscope" (, which is referred to as "field-emission electron gun chamber" in the present application) is a general term for the part to be placed on an electron microscope lens-barrel in a scanning electron microscope.

Here, the "electron microscope lens-barrel" is a cylinder portion, which includes a lens for a scanning electron microscope generally called a "focusing lens" or an "objective lens" and is loaded and installed to a scanning electron microscope.

Specifically, the "electron gun chamber for a scanning electron microscope" is the part including a high-voltage cable, an electron source, an intermediate chamber provided between the electron source chamber and the electron microscope lens-barrel of the scanning electron microscope, and an airlock valve installed between the intermediate chamber and the lens-barrel in a scanning electron microscope.

Here, the "high-voltage cable" is a cable for applying a high voltage to the cathode electrode constituting the electron source.

An "electron source" is one that generates and accelerates electron beams, and specifically includes a high-voltage insulator, a part consisting of an emitter and a cathode electrode, and an anode electrode (, which is generally referred to as an "extracting electrode" and an "accelerating electrode"). Among others, a field-emission electron source is one that applies a high electric field to the tip of a needle such as a tungsten single crystal provided at the tip of a cathode electrode in a vacuum chamber at room temperature in a high vacuum (specifically, about 10$^{-7}$ Pa or more) and extracts electrons in a strong electric field. As the emitter of the field-emission electron source, $LaB_6$ (for example, a nanowire of $LaB_6$) also known as a thermoelectron source can be used in addition to tungsten single crystal. It is preferable to use $LaB_6$, because the work function is low, the tunneling probability of electron is high, and the amount of current emitted is large.

The "electron source chamber" is a vacuum container that houses an electron source, but contains the high-voltage cable in the present application.

The "site to which the field-emission electron source is detachably attached" is the part (namely, spot) where the field-emission electron source can be attached and detached, and generally includes a flange for that purpose. However, the flange is not particularly limited as long as its purpose can be achieved. The electron source is usually attached to the top face in the electron source chamber.

The electron source chamber and intermediate chamber constituting the electron gun chamber for a scanning electron microscope are an intermediate chamber which is provided adjacent to the above electron source chamber and through which the electron beam passes in the direction of the electron beam emitted from the electron source. Since the electron source is usually attached to the top face in the electron source chamber, the electron beam progresses from the top face to the bottom face (namely, downward) in the electron source chamber.

The intermediate chamber is installed so that the top face thereof is adjacent to the bottom face of the electron source chamber. A hole generally referred to as a "throttle" or "throttle for differential exhaust" for the passage of electron beams generated (namely, emitted) from the electron source is provided between the top face in the intermediate chamber and the bottom face in the electron source chamber (namely, between the partition face of the electron chamber and the partition face of the intermediate chamber adjacent thereto). The throttle is a small hole for allowing an electron beam to pass and maintaining a pressure difference between directly connected spaces (namely, rooms), and is called an "orifice" in some cases.

The intermediate chamber is a vacuum chamber provided between the electron source chamber and the electron microscope lens-barrel of the scanning electron microscope, and the bottom face thereof is also provided with a throttle for allowing the electron source to further pass through the lens-barrel.

A difference in the degree of vacuum of 3 to 4 orders of magnitude is caused between the degree of vacuum (usually, about 10$^{-7}$ Pa order) in the electron source chamber and the degree of vacuum (usually, 10$^{-3}$ Pa order) in the electron microscope lens-barrel, and thus the intermediate chamber, which is a small space, is provided between the electron source chamber and the electron microscope lens-barrel so that the differences in the degree of vacuum between the vacuum chambers individually continue (namely, the difference in the degree of vacuum between the electron source chamber and the intermediate chamber and the difference in the degree of vacuum between the intermediate chamber and the electron microscope lens-barrel) are 2 orders of magnitude or less.

Also, an airlock valve for opening and closing the throttle provided on the bottom face of the intermediate chamber is installed in the intermediate chamber. Therefore, the intermediate chamber has an installation site of the airlock valve on the bottom face thereof.

With regard to an airlock valve, usually the electron beam from the field-emission electron source is not easily turned on/off, and the electron beam is always emitted. The airlock valve is a valve that is located between the field-emission electron gun chamber kept in a high vacuum and the electron microscope lens-barrel installed to the chamber, and plays an important role of closing when performing a decrease in the degree of vacuum in the electron microscope lens-barrel, which occurs at the exchange time of the sample of the electron microscope. The airlock valve also plays a role as an important valve that closes between the electron source chamber and the atmospheric pressure when the field-emission electron source is stored or exchanged independently.

Specific examples of the airlock valve include those illustrated in FIGS. 4A and 4B.

The airlock valve illustrated in FIG. 4A is a valve having a structure in which the O-ring sealing face is a horizontal face and the valve is closed as the valve part of the O-ring for valve seal is pushed down by the cam and the O-ring face is pressed against the vacuum sealing face.

The airlock valve illustrated in FIG. 4B is a valve having a structure in which the O-ring face is driven horizontally with a shape inclined by about 5° to 15° to apply pressure to the valve seat because the O-ring is pressed against the vacuum sealing face by horizontal movement.

In order to avoid exposure of the O-ring installed in the airlock valve to the electron beams from the field-emission electron source at the time of opening and closing, both of the valves have a structure in which the O-ring installation face is the undersurface and the sealing face is the top face so that the O-ring is not exposed to the electron source.

However, the airlock valve is not limited to those illustrated in FIGS. 4A and 4B as long as its purpose can be achieved.

Exhaust holes are installed in each of the electron source chamber and the intermediate chamber to create a high vacuum inside each thereof. Specifically, an exhaust hole for a pump for high vacuum exhaust, which is connected to a pump for high vacuum exhaust (for example, a sputter ion pump (SIP)), and an exhaust hole for a pump for preliminary vacuum exhaust, which is connected to a pump for preliminary vacuum exhaust (for example, a diffusion pump (DP) or a turbomolecular pump (TMP)) are installed in each of the electron source chamber and the intermediate chamber. The pump for preliminary vacuum exhaust is used for preliminary vacuum exhaust (namely, rough pumping) to a degree of vacuum at which the pump for high vacuum exhaust operates. Usually, the pump for preliminary vacuum exhaust such as a diffusion pump (DP) or a turbomolecular pump (TMP) is further connected to a rotary pump (RP), and the former is used for secondary vacuuming and the latter is used for primary vacuuming. However, the flange is not particularly limited as long as the purpose can be achieved. In the present application, the exhaust hole for a pump for preliminary vacuum exhaust may also be referred to as "preliminary vacuum exhaust hole".

The exhaust hole for a pump for preliminary vacuum exhaust installed in each of the electron source chamber and the intermediate chamber is installed on the continuous face of the electron source chamber and the intermediate chamber. In other words, the exhaust hole for a pump for preliminary vacuum exhaust in the electron source chamber and the exhaust hole for a pump for preliminary vacuum exhaust in the intermediate chamber are on the same face. In the present application, this face side (namely, the face on which the exhaust hole for a pump for preliminary vacuum exhaust is installed) may also be referred to as a side face for convenience.

The electron source chamber and the intermediate chamber have an opening and closing means for directly opening and closing the exhaust hole for a pump for preliminary vacuum exhaust installed in each thereof. The opening and closing means is only required to be one capable of achieving its purpose by directly opening and closing the exhaust hole for a pump for preliminary vacuum exhaust.

For example, a cylindrical concave is formed on the continuous face of the electron source chamber and the intermediate chamber, an exhaust hole connected to the electron source chamber and an exhaust hole connected to the intermediate chamber are provided on the bottom face of the concave, and these exhaust holes are used as the exhaust holes for a pump for preliminary vacuum exhaust in the electron source chamber and the intermediate chamber, respectively. In other words, the above concave straddles the exhaust hole for a pump for preliminary vacuum exhaust in the electron source chamber and the exhaust hole for a pump for preliminary vacuum exhaust in the intermediate chamber.

These exhaust holes for a pump for preliminary vacuum exhaust are closed by fitting (namely, covering) one (what is so called as "lid body") that fits into the cylindrical concave directly into the concave interlocked with sliding of the piston and opened by detaching (namely, removing) the one. The exhaust hole for a pump for preliminary vacuum exhaust is directly opened and closed by such an opening and closing means. The method of covering the lid body and the method of removing the lid body are not particularly limited as long as its purpose can be achieved, and may be a method by packing by pressing or a method by engagement. In the present application, such opening and closing of the exhaust hole for a pump for preliminary vacuum exhaust is also referred to as pressing and releasing of the lid body.

More specifically, the above examples may include the following ones.

The continuous back face of the electron source chamber and the intermediate chamber is used as the flange face, and a hole (namely, concave) is formed in the flange face, and an exhaust hole connected to the electron source chamber and an exhaust hole connected to the intermediate chamber are provided on the bottom face of the hole. These exhaust holes are used as the exhaust holes for a pump for preliminary vacuum exhaust in the electron source chamber and the intermediate chamber, respectively. These two exhaust holes for a pump for preliminary vacuum exhaust are opened and closed by a flange having a piston structure in which an O-ring seal that opens and closes the exhaust holes is attached as a valve seal. The above valve seal portion, which is driven back and forth in association with the sliding of the piston, has a structure in which the bottom face of the above hole (namely, concave) is used as a sealing face and the side face of the above hole is used as a guide. Examples of the O-ring seal include a Viton O-ring and a polyimide sheet of a heat-resistant resin.

In this way, the opening and closing means for directly opening and closing the exhaust hole for a pump for preliminary vacuum exhaust directly covers (specifically, seals) the above two exhaust holes for a pump for preliminary vacuum exhaust. This lid (specifically, seal) is one (namely, a lid body) in which a circular plane (what is so called as "disc") at the top of the piston of the cylinder and piston mechanism and a groove forming a circle around the very edge (namely, end) of this circular plane (namely, disc) are provided to hold the O-ring, that is, one (namely, a lid body) that a disc and an O-ring are integrated. Therefore, the opening and closing means for directly opening and closing the exhaust holes for a pump for preliminary vacuum exhaust in the invention of the present application has a significantly simple structure for opening and closing the above two exhaust holes for a pump for preliminary vacuum exhaust.

As in the above example, the opening and closing means for directly opening and closing the exhaust holes for a pump for preliminary vacuum exhaust can have a structure in which the respective exhaust holes for a pump for preliminary vacuum exhaust in the electron source chamber and the intermediate chamber are opened and closed at the same time. In short, the above two exhaust holes for a pump for preliminary vacuum exhaust can be directly opened and closed with the same one lid body at the same time. However, such a structure as separately performing this may be adopted. In this case, the two exhaust holes for a pump for preliminary vacuum exhaust may be directly and individually opened and closed with separate lid bodies. When using the above example, the back face of the electron source chamber is used as the flange face, and a hole (specifically, concave) is formed in the flange face, an exhaust hole (namely, an exhaust hole for a pump for preliminary vacuum exhaust) connected to the electron source chamber is provided on the bottom face of the hole, in a similar way, on the back face of the intermediate chamber as well, an exhaust hole (namely, exhaust hole for a pump for preliminary vacuum exhaust) connected to the intermediate chamber is separately provided on the bottom face of the hole, and each of these may be individually opened and closed by a flange having a piston structure in which an O-ring seal for opening and closing the exhaust hole is attached as a valve seal. In short, the above two exhaust holes for a pump for preliminary vacuum exhaust may be directly and individually opened and closed with different lid bodies.

In the invention of the present application, the above electron source chamber and the above intermediate chamber, constituting the electron gun chamber for a scanning electron microscope may be fabricated by drilling holes in the same small stainless steel block (lump) having a substantially cubic shape without performing welding process. In this case, the electron gun chamber for a scanning electron microscope of the invention of the present application has a substantially cubic shape. A cartridge heater may be attached as a heating heater for baking.

The exhaust hole for a pump for vacuum exhaust installed in each of the electron source chamber and the intermediate chamber may be installed at any position (namely, spot) as long as the object of the invention of the present application can be achieved, but it is preferable to install the exhaust holes at positions at which both the exhaust holes are symmetrical to each other from the viewpoint of efficient and high vacuum exhaust of the inside and compact structural design.

In the invention of the present application, another intermediate chamber may be further provided between the above intermediate chamber and the above electron microscope lens-barrel. For convenience, in the present application, as for the above two intermediate chambers, the above intermediate chamber is referred to as the first intermediate chamber, and the separately provided further intermediate chamber is referred to as the second intermediate chamber.

In this case, the electron gun chamber for a scanning electron microscope is specifically the part including an electron source (also including a high-voltage cable), an electron source chamber, a first intermediate chamber adjacent to the electron source chamber and a second intermediate chamber adjacent to the first intermediate chamber, which are provided between the electron source chamber and the electron microscope lens-barrel of the scanning electron microscope, and an airlock valve installed between the second intermediate chamber and the lens-barrel.

The electron source chamber, first intermediate chamber, and second intermediate chamber constituting the electron gun chamber for a scanning electron microscope are the first intermediate chamber provided adjacent to an electron source chamber and the second intermediate chamber adjacent to the lower region of the above first intermediate chamber, through which the electron beam passes in the direction of the electron beam emitted from the electron source. Since the electron source is usually attached to the top face in the electron source chamber, the electron beam progresses from the top face to the bottom face (namely, downward) in the electron source chamber.

The first intermediate chamber is installed so that the top face thereof is adjacent to the bottom face of the electron source chamber. Throttles for the passage of electron beams generated (namely, emitted) from the electron source are provided between the top face of the inside of the first intermediate chamber and the bottom face of the inside of the electron source chamber (namely, between the partition face of the electron chamber and the partition face of the intermediate chamber adjacent thereto) and between the top face of the inside of the second intermediate chamber and the bottom face of the inside of the first intermediate chamber (namely, between the partition face of the first intermediate chamber and the partition face of the second intermediate chamber adjacent thereto).

The second intermediate chamber has an installation site of the airlock valve.

In the second intermediate chamber, a cylindrical small-diameter through hole centered on the throttle provided between the second intermediate chamber and the lower portion of the intermediate chamber 1 is provided from the top face to the bottom face of the second intermediate chamber. However, this through hole is provided so as not to penetrate the bottom face of the first intermediate chamber adjacent to the top face of the second intermediate chamber, but to penetrate the bottom face of the second intermediate chamber. In other words, the above through hole does not penetrate the partition face between the first intermediate chamber and the second intermediate chamber, but penetrates the partition face between the second intermediate chamber and the electron microscope lens-barrel installed to the second intermediate chamber. With regard to the above through hole, an airlock valve to be installed in the second intermediate chamber is installed, and the airlock valve is also provided with a through hole so that the electron beam passes through the inside of the airlock valve only when in the open state.

The size of the through hole is only required to be a size so that the through hole can function as a passage tract for electron beams and the object of the invention of the present application can be achieved.

The face (namely, O-ring face) on which the O-ring constituting the airlock valve is installed is inclined upward with an inclination axis of 60° or more and 80° or less with respect to the adjacent face (namely, partition face) of the first intermediate chamber and the second intermediate chamber. In other words, the airlock valve is inclined upward with an inclination axis of 60° or more and 80° or less from the perpendicular face to the face direction in which the installed airlock valve is driven and moves in the front-back direction.

A concave hole is formed in the O-ring face sealing face greatly inclined upward in this way and on the inner side of the O-ring face, and a convex portion to be fitted into this concave portion is provided on the inner side of the O-ring for sealing and used for fitting. This convex portion usually has a cylindrical shape (specifically, a substantially cylindrical shape extending upward). The above through hole provided in the airlock valve is formed in this convex portion.

Since the airlock valve has such a structure, when the airlock valve is installed, the O-ring is in shadow of the convex portion in the center, and thus the electron beam does not directly hit the O-ring surface even in a state in which the airlock valve is open.

Since the airlock valve has such a structure, the installed airlock valve itself is placed outside the first intermediate chamber which is put in vacuum state. Therefore, the load of vacuum exhaust of the intermediate chamber is significantly small as compared to the case of vacuum-exhausting the intermediate chamber including an airlock valve in the chamber as in the conventional case.

In a case of driving the airlock valve, the convex portion is slid in the direction perpendicular to the inclination axis, thus the drive shaft and the O-ring sealing face are perpendicular to each other, and the driving force is directly applied to the O-ring sealing face. Therefore, it can be said that the airlock valve has a simpler structure than the conventional one.

As described above, when the airlock valve is opened, the electron beam passes through the cylindrical through hole of the convex portion in the O-ring, and it is substantially avoided that the scattered electron beam hits the O-ring. However, due to its structure, strictly speaking, a part of the O-ring surface is directly exposed to the through hole when the airlock valve is opened, and thus the exposed part is exposed to the electron beam path. Hence, in order to completely prevent the O-ring face from being exposed to the electron beam path in the airlock valve, an opening and closing type shielding plate may be installed on the convex portion at a place corresponding to the exposed part. For example, the structures illustrated in FIGS. 5, 6A and 6B may be illustrated.

In order to avoid exposure of the O-ring installed in the airlock valve to the electron beams from the field-emission electron source at the time of opening and closing, a conventional airlock valve constituting a field-emission electron gun chamber has a structure in which the O-ring installation face is the undersurface and the sealing face is the top face so that the O-ring is not exposed to the electron source (see FIGS. 4A and 4B). For this reason, a conventional airlock valve is provided in the intermediate chamber. Its opening and closing is driven by opening and closing by a shaft that is taken in and out from the horizontal direction. Since the O-ring is pressed against the vacuum sealing face by horizontal movement, as illustrated in FIG. 4B, the airlock valve has a structure in which the O-ring face is driven horizontally in the form of being inclined by about 5° to 15° to apply pressure to the valve seat. Alternatively, as illustrated in FIG. 4A, the airlock valve has a structure in which the O-ring sealing face is a horizontal face and the airlock valve is closed as the valve part of the O-ring for valve seal is pushed down by the cam and the O-ring face is pressed against the vacuum sealing face. Since the drive unit and the sealing face form an angle of approximately 90°, the structure is complicated. In this structure, the airlock valve and the drive unit are installed in the intermediate chamber of which the inside is put in vacuum state, and thus the structure is complicated and the load of vacuum exhaust of the intermediate chamber is large.

However, since the airlock valve installed in the second intermediate chamber has the structure as described above, the above-mentioned problems that occur in the field-emission electron gun chamber using a conventional airlock valve can be solved.

The electron gun chamber for a scanning electron microscope of the invention of the present application may be used to fabricate an electron gun or a scanning electron microscope.

EXAMPLES

Next, embodiments of the invention of the present application w % ill be described in more detail with reference to Examples, but the present embodiments are not limited to the following Examples as long as the gist thereof is not exceeded.

Embodiment 1

The structure of an embodiment of the field-emission electron gun chamber of the invention of the present application is illustrated in FIG. 3A as a front view and a side view.

The front view of FIG. 3A illustrates a state in which the airlock valve 3 is closed. The side view of FIG. 3A illustrates that the airlock valve 3 and the preliminary exhaust valve (namely, roughing valve) 6 are opened and closed by sliding in the direction of the arrow.

[Structure of Field-Emission Electron Gun Chamber]

In the field-emission electron gun chamber of the present embodiment 1, the electron source chamber 2, the intermediate chamber 1, the airlock valve 3, and the preliminary exhaust valve (namely, roughing valve) 6 are configured by an integral block (in particular, an integral block having a substantially cubic shape) as illustrated in FIG. 3A. Therefore, the field-emission electron gun chamber of the present embodiment 1 can have a substantially cubic shape (cubic). The preliminary exhaust valve (namely, roughing valve) 6 is connected to a separately provided pipe for vacuum exhaust 5 for rough pumping.

Here, as the dimensions, for example, the dimensions of the ConFlat vacuum flange (standard size: ICF70) are used as the standard and 70 mm cubic is the basis. A hole having a diameter ($\Phi$) of 40 mm and a length (L) of 35 mm is provided in the upper half of the cube to form the electron source chamber 2, and below it, a cylindrical space having a diameter ($\Phi$) of about 7 mm and a length (L) of about 20 mm is provided to form the intermediate chamber 1 to be exhausted to a high vacuum. A throttle having a diameter ($\Phi$) of 0.5 mm to a diameter ($\Phi$) of 1 mm (namely, a throttle for differential exhaust) is provided on the top face and bottom face of the cylindrical intermediate chamber 1. The throttle is a small hole for allowing an electron beam to pass and maintaining a pressure difference between directly connected spaces (rooms), and may be referred to as an "orifice".

The four faces of the top face, back face, and left and right faces of the field-emission electron gun chamber of the present embodiment 1 are used as the flange faces of the ConFlat vacuum flange (standard size: ICF70). An electron source is installed on the top face. Specifically, in the top face, the high-voltage insulator and the cathode electrode which constitute the electron source are connected each other.

The back face has a structure in which a hole (namely, exhaust hole) leading to the outside is provided in each of the electron source chamber 2 and the intermediate chamber 1 and the inside of each of the electron source chamber 2 and the intermediate chamber 1 is vacuum-exhausted, what is so called as "valve structure for vacuum exhaust", as illustrated in the side view of FIG. 3A.

A piston-shaped flange with O-ring that opens and closes these two holes (namely, the respective exhaust holes provided in the electron source chamber 2 and the intermediate chamber 1) is provided on the ConFlat vacuum flange (standard size: ICF70) of the back face, thereby forming a preliminary exhaust valve 6.

On the left and right flange faces of the ConFlat vacuum flange (standard size: ICF70), as illustrated in the front view of FIG. 3A, two ion pumps are individually connected to the electron gun chamber 2 and the intermediate chamber 1, thereby performing high vacuum exhaust of the inside of each of the electron gun chamber 2 and the intermediate chamber 1.

The airlock valve 3 is provided on the bottom face of the intermediate chamber 1 as illustrated in FIG. 3A. The airlock valve 3 is a valve for vacuum-isolating the vacuum at each part of the electron source chamber 2 and the intermediate chamber 1 from the vacuum inside the field-emission electron gun chamber and the installed electron microscope lens-barrel when the scanning electron microscope is used, and by this, each vacuum chamber is vacuum-isolated as well as the electron beam passes through the above throttle for differential exhaust provided on the bottom face of the intermediate chamber 1 by opening the valve only when the image is observed.

The airlock valve 3 is provided on the bottom face of the intermediate chamber 1 as in FIG. 3A.

In the field-emission electron gun chamber, the airlock valve plays an important role as follows.

Usually, the electron beam from the field-emission electron source is not easily turned on/off, and the electron beam is always emitted. The airlock valve is located between the field-emission electron gun chamber kept in a high vacuum and the electron microscope lens-barrel installed to the chamber, and plays an important role of closing when performing a decrease in the degree of vacuum in the electron microscope lens-barrel, which occurs at the exchange time of the sample of the electron microscope. The airlock valve also plays a role as an important valve that closes between the electron source chamber and the atmospheric pressure when the field-emission electron source is stored or exchanged independently.

Specific embodiments of the airlock valve 3 illustrated in FIG. 3A are illustrated in FIGS. 4A and 4B. However, the airlock valve 3 is only required to play the above roles, and is not limited to these.

FIG. 4A is a structure in which the O-ring sealing face is a horizontal face because the O-ring is pressed against the vacuum sealing face by horizontal movement, and the airlock valve 3 is closed as the valve part of the O-ring for valve seal is pushed down by the cam and the O-ring face is pressed against the vacuum sealing face.

FIG. 4B is a structure in which the O-ring face is driven horizontally in the form of being inclined by about 5° to 15° to apply pressure to the valve seat.

In both structures, as illustrated in these figures, a conventional airlock valve constituting a field-emission electron gun chamber has a structure in which the O-ring installation face is the undersurface and the sealing face is the top face so that the O-ring is not exposed to the electron source in order to avoid exposure of the O-ring installed in the airlock valve to the electron beams from the field-emission electron source at the time of opening and closing. For this reason, a conventional airlock valve is provided in the intermediate chamber. Its opening and closing is driven by a shaft that is taken in and out from the horizontal direction.

As described above, the intermediate chamber 1 is isolated from the vacuum of the electron microscope lens-barrel connected to the field-emission electron gun chamber by the airlock valve 3 when the scanning electron microscope is used. In other words, when the electron microscope lens-barrel is connected to the field-emission electron gun chamber and this is used as a scanning electron microscope, the lower region of the installation face of the airlock valve 3 (in other words, the bottom face of the intermediate chamber 1) is a vacuum chamber. On the bottom face of the field-emission electron gun chamber having a substantially cubic shape (cubic), a structure that can be connected by a Viton O-ring is prepared for connection with the electron microscope lens-barrel.

[Structure of Preliminary Exhaust Valve (Roughing Valve) 6]

As described above, the field-emission electron gun chamber of the present invention illustrated in FIG. 3A has the feature that the electron source chamber 2, the intermediate chamber 1, the airlock valve 3, and the preliminary exhaust valve (roughing valve) 6 are configured as an integrated block, and this feature is mainly brought about by using the preliminary exhaust valve (roughing valve) 6 that constitutes the field-emission electron gun chamber and is illustrated in the side view of FIG. 3A. This preliminary exhaust valve (namely, roughing valve) 6 is one having still never been used as a preliminary exhaust valve (namely, roughing valve) of a field-emission electron gun chamber.

Hence, the structure of the preliminary exhaust valve (namely, roughing valve) 6 illustrated in the side view of FIG. 3A will be described in more detail.

The preliminary exhaust valve (namely, roughing valve) 6 secures a vacuum path (specifically, a roughing path) between the electron source chamber 2 and the intermediate chamber 1 and adjusts the vacuum inside each thereof.

The back face of the field-emission electron gun chamber forms the flange face of ConFlat vacuum flange (for example, standard size. ICF70), and a hole (namely, concave) having a diameter ($\Phi$) of 36 mm and a length (L) of 12 mm is provided in the flange face. An exhaust connected to the electron source chamber 2 and an exhaust hole connected to the intermediate chamber 1 are provided on the bottom face of the above hole (namely, concave). These two exhaust holes are opened and closed by a flange (which is also referred to as a "valve seal portion" in the present application) having a piston structure in which an O-ring seal that opens and closes the exhaust holes is attached as a valve seal. The above valve seal portion, which is driven back and forth in association with the sliding of the piston, has a structure in which the bottom face of the above hole (namely, concave) is used as a sealing face and the side face of the above hole is used as a guide. In this way, the vacuum valve (namely, the preliminary exhaust valve 6 in the side view of FIG. 3A) according to the present embodiment 1 is configured. This vacuum valve is opened during baking (in other words, during vacuum baking). Specifically, by having a configuration (namely, preliminary exhaust valve 6 and pipe for vacuum exhaust 5 illustrated in the side view of FIG. 3A) in which the above valve seal moves backward and thus the above two exhaust holes are connected to the separately provided pipe for vacuum exhaust 5 (vacuum exhaust) during vacuum baking, the insides of the electron source chamber 2 and the intermediate chamber 1 are rough pumped. As the vacuum exhaust method using the pipe for vacuum exhaust 5, the conventional technology described in FIGS. 1 and 2 may be applied.

A Viton O-ring is used as the O-ring seal, but it is also possible to use a polyimide sheet of a heat-resistant resin instead of the O-ring due to the structure of the preliminary exhaust valve provided in the present invention.

As described above, the preliminary exhaust valve (namely, roughing valve) 6 has a simple structure in which the part that seals and covers the above two exhaust holes is closed with one valve, what is so called as one disc/O-ring. In other words, the preliminary exhaust valve (namely, roughing valve) 6 has a simple structure capable of being opened and closed by one valve structure.

In the present embodiment 1, the preliminary exhaust valve is configured such that the two preliminary exhaust valves are opened and closed at the same time, and thus is more rational as a roughing means.

From the above, when compared to the conventional field-emission electron gun chamber (see FIGS. 1 and 2), the conventional one includes two preliminary exhaust valves (namely, roughing valves) and a complicated pipe for vacuum exhaust connected to the valves in order to secure a roughing path and thus is large as a whole. However, the field-emission electron gun chamber having a substantially cubic shape (cubic) in the present embodiment 1 uses the above-described preliminary exhaust valve (namely, roughing valve) 6 as the preliminary exhaust valve thereof, thus has a structure in which the roughing path, the valve, and the chamber are substantially contained inside thereof, and thus is compact and small as a whole.

In the present embodiment 1, as described above, only one preliminary exhaust valve corresponding to the conventional two preliminary exhaust valves is required, moreover the preliminary valve has a simple structure in which the part that seals and covers the above two exhaust holes is closed with one disc/O-ring, further is also configured such that two preliminary exhaust valves, which have been conventionally opened and closed separately, can be opened and closed at the same time, and thus is more rational as a roughing means.

Embodiment 2

The structure of another embodiment of the field-emission electron gun chamber of the invention of the present application is illustrated in FIG. 3B as a front view and a side view. Regarding the configuration in the present embodiment, the configuration that is not particularly described or suggested here and is described in the embodiment 1 is similarly applied to this embodiment as well.

[Structure of Field-Emission Electron Gun Chamber]

The field-emission electron gun chamber of the present embodiment 2 illustrated in FIG. 3B is entirely the same as that of the embodiment 1 (FIG. 3A) except that the structure and placing means of the airlock valve 3 constituting the chamber are different and accordingly a part of the vacuum exhaust system are different.

The front view of FIG. 3B illustrates a state in which the airlock valve 3 is closed. The side view of FIG. 3B illustrates a state in which the airlock valve 3 is opened, and illustrates that the airlock valve 3 and the preliminary exhaust valve (namely, roughing valve) 6 are opened and closed by sliding in the direction of the arrow.

Figure 6A:
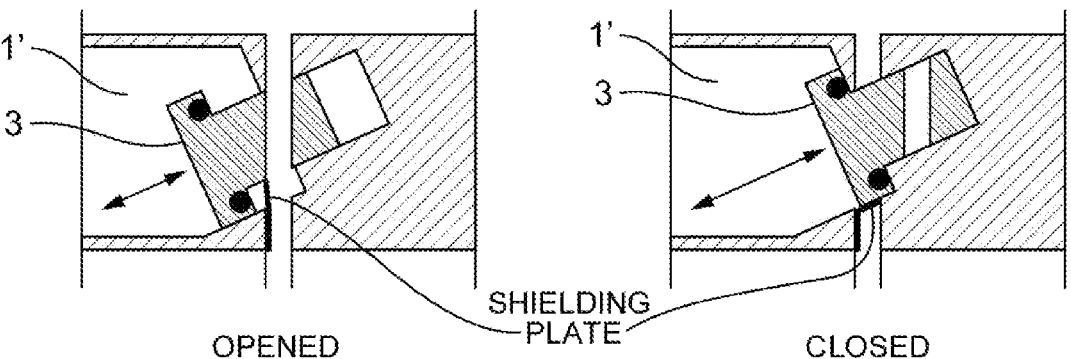
FIG. 6A is an enlarged view (specifically, schematic view) of an embodiment of the part of an airlock valve with shielding plate (namely, the airlock valve part in FIG. 5) installed in a field-emission electron gun chamber according to an embodiment of the invention of the present application.
Figure 6B:
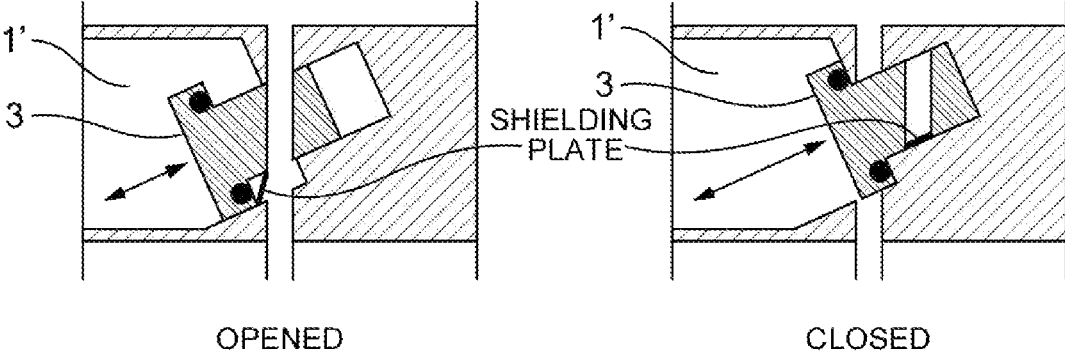
FIG. 6B is an enlarged view (specifically, schematic view) of an embodiment of the part of an airlock valve with shielding plate (namely, the airlock valve part in FIG. 5) installed in a field-emission electron gun chamber according to an embodiment of the invention of the present application.

Specific embodiments related to the structure and placing means of the airlock valve 3 illustrated in FIG. 3B are illustrated in detail in FIGS. 5, 6A and 6B. This point will be described later.

In the field-emission electron gun chamber of the present embodiment 2 illustrated in FIG. 3B, the intermediate chamber 1 (which may be referred to as the first intermediate chamber in the present application) does not include the airlock valve 3, different from the present embodiment 1 illustrated in FIG. 3A. The airlock valve 3 is installed in another intermediate chamber 1' (which may be referred to as the second intermediate chamber in the present application) adjacent to the bottom face of the intermediate chamber 1. The outline of each configuration of the electron source chamber 2, the intermediate chamber 1, the airlock valve 3, and the intermediate chamber 1' in the field-emission electron gun chamber is as illustrated in FIG. 5.

Regarding the field-emission electron gun chamber of the present embodiment 2, as the dimensions, for example, the dimensions of the ConFlat vacuum flange (standard size: ICF70) are used as the standard and 70 mm cubic is the basis similarly to those in the embodiment 1. A hole having a diameter ($\Phi$) of 40 mm and a length (L) of 35 mm is provided in the upper half of the cube to form the electron source chamber 2, and below it, a cylindrical space having a diameter ($\Phi$) of about 7 mm and a length (L) of about 20 mm is provided to form the intermediate chamber 1 to be exhausted to a high vacuum. A throttle having a diameter ($\Phi$) of 0.5 mm to a diameter ($\Phi$) of 1 mm (namely, a throttle for differential exhaust) is provided on the top face and bottom face of the cylindrical intermediate chamber 1.

On the top face of the intermediate chamber 1', a throttle for differential exhaust (namely, a throttle having a diameter ($\Phi$) of 0.5 mm to a diameter ($\Phi$) of 1 mm) provided between the intermediate chamber 1' and the lower portion of the intermediate chamber 1 is provided, a small cylindrical through hole having a diameter ($\Phi$) of 1.5 mm to 2 mm centered on the differential exhaust throttle is further provided from the top face to the bottom face of the intermediate chamber 1' (however, the above through hole is provided so as not to penetrate the bottom face of the intermediate chamber 1 adjacent to the top face of the intermediate chamber 1' but to penetrate the bottom face of the intermediate chamber 1'). This is used as a passage tract for electron beams. At that time, the through hole is provided so as to penetrate the sealing face of the airlock valve 3 installed in the intermediate chamber 1' as well (this state is the open state illustrated in FIGS. 5, 6A and 6B).

A Viton rubber O-ring is used for the airlock valve 3. Since the airlock valve 3 is open at the time of baking at 200° C., deformation of the O-ring due to baking heating can be avoided.

The sealing face of the airlock valve 3 is a face that is greatly inclined upward by 75° from the perpendicular face of the optical axis (specifically, the perpendicular face to the face direction in which the airlock valve 3 is driven and moves in the front-back direction). The airlock valve 3 is opened and closed by a drive unit attached to the front face along this angle. The outer bottom face of the intermediate chamber 1' (namely, the outer bottom face of the field-emission electron gun chamber (having a substantially cubic shape (cubic)) of the present embodiment 2) has a structure connected to the electron microscope lens-barrel by a flange structure.

In the field-emission electron gun chamber of the present embodiment 2 as well, the same preliminary exhaust valve (namely, roughing valve) 6 as in the embodiment 1 is used, but the intermediate chamber 1' is provided separately from the intermediate chamber 1, and thus the vacuum exhaust system is partially different. Specifically, the intermediate chamber 1' in which the airlock valve 3 is installed has a structure connected to the preliminary exhaust valve 6 (namely, a valve that secures a roughing path of the electron source chamber 2 and the intermediate chamber 1 and adjusts the vacuum inside each thereof) on its back face as illustrated in the side view of FIG. 3B, and is connected to a separately provided preliminary vacuum exhaust pipe (specifically, pipe for vacuum exhaust 5) connection flange.

In the present embodiment 2 as well, as in the embodiment 1 (FIG. 3A), the back face of the field-emission electron gun chamber forms the flange face of ConFlat vacuum flange (for example, standard size: ICF70), and a hole (namely, concave) having a diameter (D) of 36 mm and a length (L) of 12 mm is provided in the flange face. On the bottom face of the above hole (namely, concave), an exhaust hole connected to the electron source chamber 2 and an exhaust hole connected to the intermediate chamber 1 are provided. These two exhaust holes are opened and closed by a flange (which is also referred to as a "valve seal portion" in the present application) having a piston structure in which an O-ring seal that opens and closes the exhaust holes is attached as a valve seal. The above valve seal portion, which is driven back and forth in association with the sliding of the piston, has a structure in which the bottom face of the above hole (namely, concave) is used as a sealing face and the side face of the above hole (namely, concave) is used as a guide. In this way, the vacuum valve (specifically, the preliminary exhaust valve 6) according to the present embodiment 2 is configured. This vacuum valve is opened during baking (in other words, during vacuum baking). Here, in the present embodiment 2, as illustrated in the side view of FIG. 3B, when the above valve seal moves backward at the time of vacuum baking, the above two exhaust holes are connected to the preliminary vacuum exhaust hole (namely, the preliminary vacuum exhaust hole that is provided on the lower side face of the hole (namely, concave) having a diameter (Φ) of 36 mm and a length (L) of 12 mm and illustrated in the side view of FIG. 3B) in order to secure a roughing path provided in the intermediate chamber 1' in which the airlock valve 3 is installed. Since this preliminary vacuum exhaust hole is connected to the separately provided pipe for vacuum exhaust 5 (namely, vacuum exhaust), the inside of the intermediate chamber 1' is also vacuum-exhausted by the rough pumping thereof in addition to the electron source chamber 2 and the intermediate chamber 1.

As described above, compared the present embodiment 2 with the embodiment 1 (specifically, FIG. 3A), the structure and placing means of the airlock valve 3 constituting the chamber are different from each other and accordingly a part of the vacuum exhaust system is also different from each other.

However, in comparison with a conventional field-emission electron gun chamber (see FIGS. 1 and 2), the present embodiment 2 also uses the preliminary exhaust valve (namely, roughing valve) 6 similar to that of the above embodiment 1, thereby having a structure in which the roughing path, the valve, and the chamber are substantially contained inside thereof, and thus is compact and small as a whole.

In the present embodiment 2 as well, similarly to the embodiment 1, only one preliminary exhaust valve corresponding to the conventional two preliminary exhaust valves is required, moreover the preliminary valve has a simple structure in which the part that seals and covers the above two exhaust holes is closed with one disc/O-ring, further is also configured such that two preliminary exhaust valves, which have been conventionally opened and closed separately, can be opened and closed at the same time, and thus is more rational as a roughing means.

Embodiment 3

The structure of another embodiment of the field-emission electron gun chamber of the invention of the present application is illustrated in FIGS. 5, 6A and 6B as a front view and a side view. Regarding the configuration in the present embodiment, the configuration that is not particularly described or suggested here and is described in the embodiments 1 and 2 is similarly applied to the present embodiment as well.

[Structure of Field-Emission Electron Gun Chamber]

Figure 1:
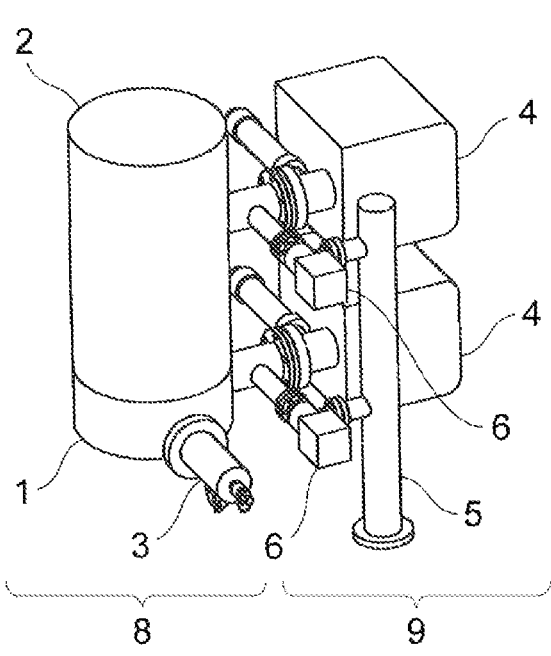
FIG. 1 is an external view of a general field-emission electron gun chamber and its vacuum exhaust system.
Figure 2:
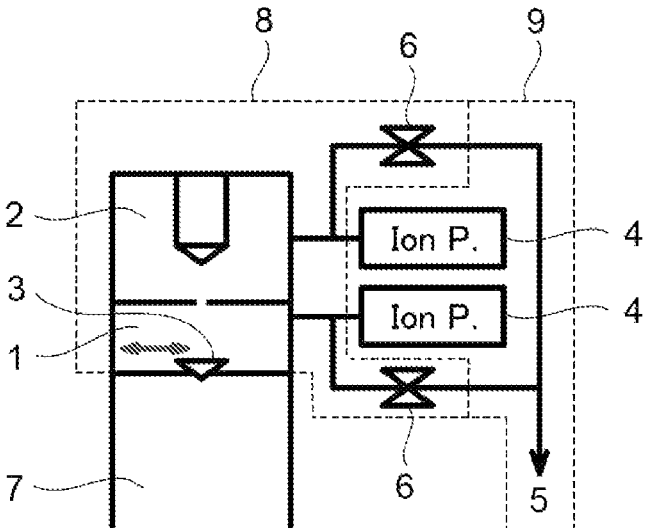
FIG. 2 is a cross-sectional view (specifically, schematic view) of a general field-emission electron gun chamber and its vacuum exhaust system.

The field-emission electron gun chamber of the present embodiment 3 has the feature of being configured using the electron source chamber 2, the intermediate chamber 1, the airlock valve 3, and the intermediate chamber 1' similarly to that of the embodiment 2 (see FIG. 3B) as illustrated in FIGS. 5, 6A and 6B. Here, as the preliminary exhaust valve (namely, roughing valve), a preliminary exhaust valve (namely, roughing valve) 6 similar to that in the embodiment 2 illustrated in the side view of FIG. 3B is preferably used, but the conventional preliminary exhaust valve (namely, roughing valve) 6 illustrated in FIGS. 1 and 2 may be used. However, when the conventional preliminary exhaust valve (namely, roughing valve) 6 illustrated in FIGS. 1 and 2 is used, the preliminary vacuum exhaust hole (namely, the preliminary vacuum exhaust hole that is provided on the lower side face of the hole (namely, concave) having a diameter (Φ) of 36 mm and a length (L) of 12 mm and illustrated in the side view of FIG. 3B) for securing a roughing path provided in the intermediate chamber 1' in which the airlock valve 3 is installed is connected to the pipe for vacuum exhaust 5 (namely, vacuum exhaust) separately provided in FIGS. 1 and 2, and the inside of the intermediate chamber 1' is also vacuum-exhausted by the rough pumping thereof in addition to the electron source chamber 2 and the intermediate chamber 1.

[Structure and Placing Means of Airlock Valve 3]

The airlock valve 3 constituting the field-emission electron gun chamber of the present embodiment 3 is installed in the intermediate chamber 1' as illustrated in FIGS. 5, 6A and 6B. Specifically, the airlock valve 3 is installed in the intermediate chamber 1' that is adjacent to the bottom face of the intermediate chamber 1 and is between the intermediate chamber 1 and the electron microscope lens-barrel being installed to the field-emission electron gun chamber.

Regarding the field-emission electron gun chamber of the present embodiment 3, as the dimensions, for example, the dimensions of the ConFlat vacuum flange (standard size: ICF70) are used as the standard and 70 mm cubic is the basis similarly to those in the embodiment 1. A hole having a diameter (Φ) of 40 mm and a length (L) of 35 mm is provided in the upper half of the cube to form the electron source chamber 2, and below it, a cylindrical space having a diameter (Φ) of about 7 mm and a length (L) of about 20 mm is provided to form the intermediate chamber 1 to be exhausted to a high vacuum. A throttle having a diameter (Φ) of 0.5 mm to a diameter (Φ) of 1 mm (namely, a throttle for differential exhaust) is provided on the top face and bottom face of the cylindrical intermediate chamber 1.

On the top face of the intermediate chamber 1', a throttle for differential exhaust (a throttle having a diameter (Φ) of 0.5 mm to a diameter (Φ) of 1 mm) provided between the intermediate chamber 1' and the lower portion of the intermediate chamber 1 is provided, a small cylindrical through hole having a diameter (<b) of 1.5 mm to 2 mm centered on the differential exhaust throttle is further provided from the top face to the bottom face of the intermediate chamber 1' (however, the above through hole is provided so as not to penetrate the bottom face of the intermediate chamber 1 adjacent to the top face of the intermediate chamber 1' but to penetrate the bottom face of the intermediate chamber 1'). This is used as a passage tract for electron beams. At that time, the through hole is provided so as to penetrate the sealing face of the airlock valve 3 installed in the intermediate chamber 1' as well (this state is the open state illustrated in FIGS. 5, 6A and 6B).

The installation face (namely, O-ring face) of the O-ring to be installed on this airlock valve 3 is greatly inclined upward by 75° from the perpendicular face of the optical axis. The O-ring is on the top face and thus may be possible to receive irradiation with the electron beam. However, a concave hole is formed in the O-ring sealing face greatly inclined upward by 75° and on the inner side of the O-ring face, and a cylindrical convex portion to be fitted into this concave portion is provided on the inner side of the O-ring for sealing and used for fitting. Therefore, the above through hole of the airlock valve 3 is formed in this convex portion as illustrated in FIGS. 5, 6A and 6B. The O-ring is in shadow of the convex portion in the center, and thus the airlock valve has a structure in which the electron beam does not directly hit the O-ring surface even in a state in which the shielding plate illustrated in the figures is not attached.

Since the airlock valve 3 has such a structure, the airlock valve 3 itself is placed outside the intermediate chamber 1 which is put in vacuum state. Therefore, the load of vacuum exhaust of the intermediate chamber is significantly small as compared to the case of vacuum-exhausting the intermediate chamber including the airlock valve 3 in the chamber as in the conventional case.

The drive shaft and the O-ring sealing face are perpendicular to each other, the driving force is directly applied to the O-ring sealing face, and the structure of the airlock valve becomes simple.

When the airlock valve 3 is opened, the electron beam passes through the cylindrical through hole of the convex portion in the O-ring, and it is substantially avoided that the scattered electron beam hits the O-ring. However, as illustrated in FIGS. 5, 6A and 6B, in a state in which the shielding plate illustrated in the figures is not attached, a part of the O-ring surface is exposed to the through hole due to its structure, strictly speaking. In other words, the exposed part is exposed to the electron beam path. If it is desired to avoid this state, as illustrated in FIGS. 5, 6A and 6B, the O-ring face can be in a state of not being completely exposed to the electron beam path by providing the convex portion with an opening and closing type shielding plate. Specifically, for example, a shielding plate having the structure illustrated in FIGS. 6A and 6B can be provided. In FIG. 6A, as illustrated therein, the shielding plate has a simple structure of the following: installing a shielding plate with leaf spring on the inner side face of the through hole in the intermediate chamber 1' so as to completely shielding the O-ring surface exposed to the through hole, thereby passing the electron beam through the through hole (namely, which indicates the open state); and bending by using the joint of the leaf spring as a fulcrum and fall over so as to shut the through hole, thereby blocking the passage of electron beams (namely, which indicates the closed state). In FIG.

6B, as illustrated therein, the shielding plate has a structure of: installing a shielding plate on the convex portion so as to completely shield the O-ring surface exposed to the through hole, thereby passing the electron beam through the through hole (namely, which indicates the open state); and stowing inside the convex portion so as to shut the through hole in the convex portion, thereby blocking the passage of electron beams (namely, which indicates the closed state).

However, the above shielding plate structures are an example, and the structure and installation method of shielding plate are not particularly limited as long as the purpose of shielding can be achieved and the object of the invention of the present application can be achieved.

In the airlock valve 3 constituting the field-emission electron gun chamber of the present embodiment 3, direct irradiation of O-ring with electron beams can be avoided, moreover the O-ring is not exposed to the electron beam path, furthermore the airlock valve 3 is provided outside the intermediate chamber 1, and thus the field-emission electron gun chamber of the present embodiment 3 can have a simple structure and has a great advantage that the vacuum exhaust load is greatly reduced.

An expensive vacuum bellow (for example, a welded bellows or a molded bellows) has been conventionally required for the vacuum seal of the moving portion of the valve drive shaft, but the drive unit of the airlock valve 3 of the present embodiment is provided outside the intermediate chamber 1 which is put in vacuum state, and thus the cost is greatly reduced.

The airlock valve 3 constituting the field-emission electron gun chamber of the present embodiment 3 can also adopt an O-ring as a sliding seal for evacuating the electron microscope lens-barrel installed to the intermediate chamber 1' including the airlock valve, and thus the cost is greatly reduced.

Embodiment 4

Figure 7A:
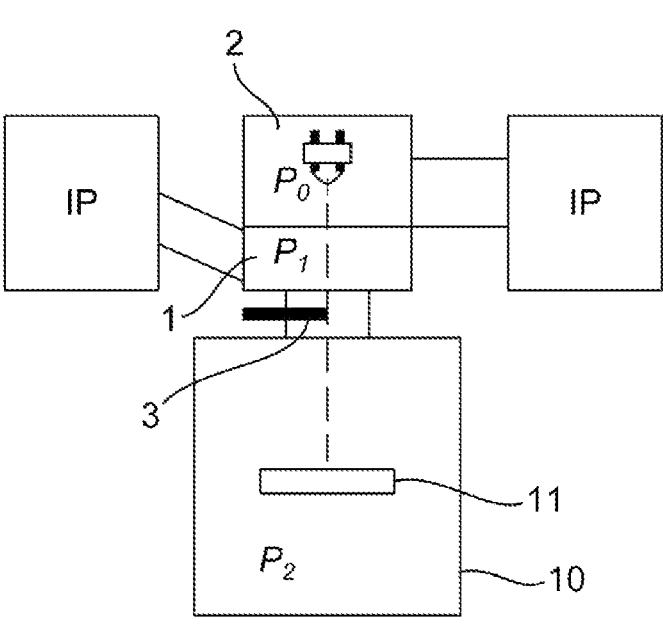
FIG. 7A is a schematic view of a scanning electron microscope according to an embodiment of the invention of the present application.

A schematic view of the structure of an embodiment of a scanning electron microscope including the field-emission electron gun chamber of the invention of the present application is illustrated in FIG. 7A. Here, since the field-emission electron gun chamber of the embodiment 2 is used as the field-emission electron gun chamber of the invention of the present application, the outline of the field-emission electron gun chamber in FIG. 7A is as illustrated in FIG. 3B. In short, the electron source chamber 2, the intermediate chamber 1, the airlock valve 3, and the IP (namely, the ion pump), constituting the field-emission electron gun chamber in FIG. 7A correspond to the electron source chamber 2, the intermediate chamber 1, the airlock valve 3, and the IP in FIG. 3, respectively.

In FIG. 7A, the airlock valve 3 and the electron microscope lens-barrel 7 are simplified for convenience, but their specific structures and places are as illustrated in FIGS. 5, 6A and 6B. In short, as illustrated in FIGS. 5, 6A and 6B, in actual, the airlock valve 3 is installed in the intermediate chamber 1' adjacent to the bottom face of the intermediate chamber 1, and further the electron microscope lens-barrel 7 is connected to the intermediate chamber 1' by a flange.

As illustrated in FIG. 7A, the scanning electron microscope is configured by connecting the electron microscope lens-barrel 7 on which the field-emission electron gun chamber is placed to a sample chamber 10. Although not illustrated, a leak valve (namely, a vacuum valve) is attached to the sample chamber 10.

In this case, the electron beam emitted from the field-emission electron source passes through the orifice provided between the bottom face of the electron source chamber 2 and the top face of the intermediate chamber 1, the throttle for differential exhaust provided on the bottom face of the intermediate chamber 1, and the passage tract of electron beam provided in the intermediate chamber 1' which is adjacent to the bottom face of the intermediate chamber 1 and in which the airlock valve 3 is installed, with the airlock valve 3 open. And, the above electron beam further passes through the inside of the electron microscope lens-barrel connected to the intermediate chamber 1' by a flange, and then reaches the sample on a sample stage 11 installed in the sample chamber 10. This outline is illustrated by the dashed line in FIG. 7A.

As illustrated in FIG. 7A, the pressure in the electron source chamber 2 is denoted by $P_0$, the pressure in the intermediate chamber 1 is denoted by $P_1$, and the pressure in the sample chamber 10 is denoted by $P_2$.

As the emitter of the field-emission electron source, $LaB_6$ is used as the emitter.

Figure 7B:
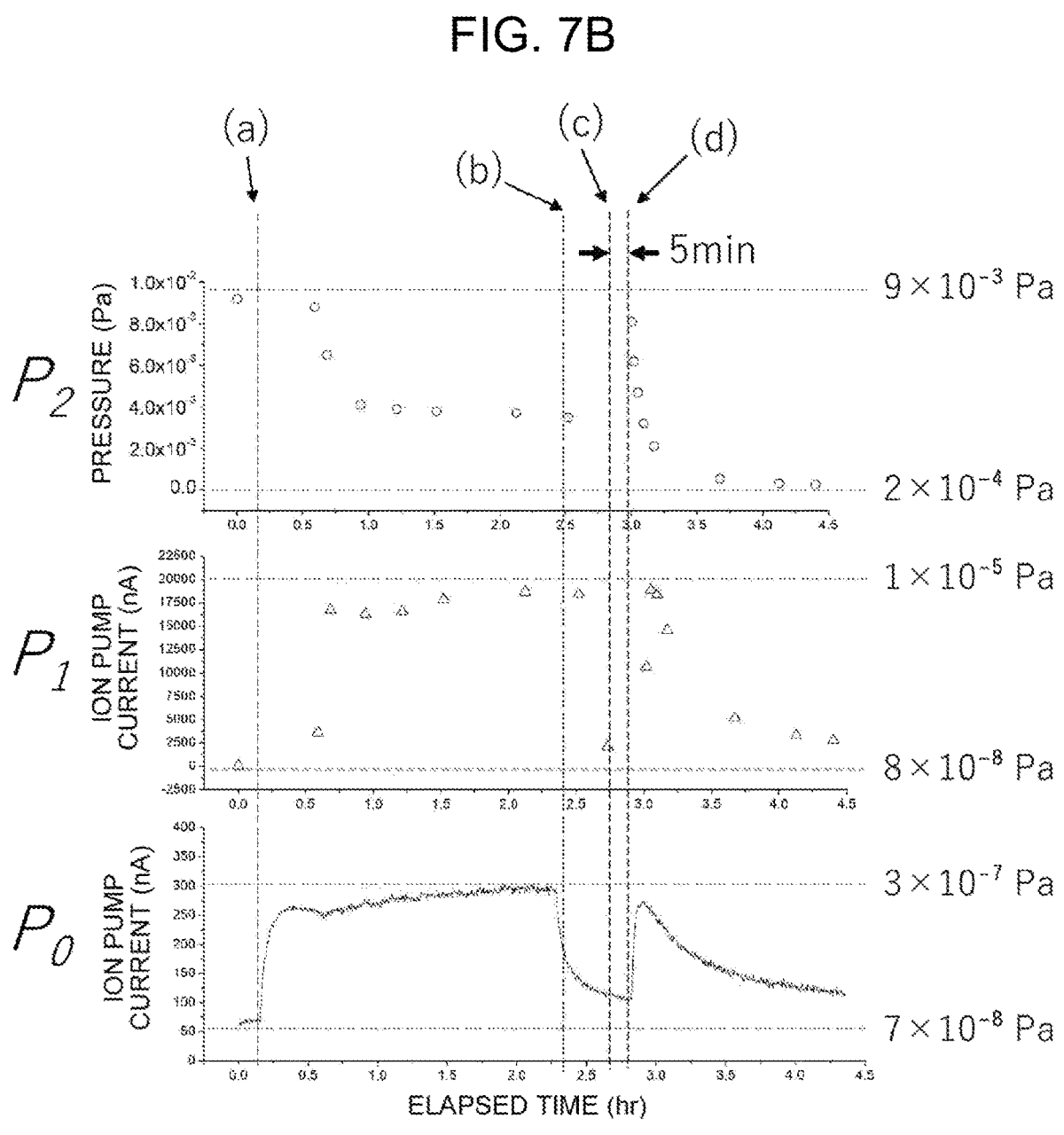

FIG. 7B is a graph illustrating the relation between the respective pressures (unit: Pa) of the pressure ($P_0$) in the electron source chamber 2, the pressure ($P_1$) in the intermediate chamber 1, and the pressure ($P_2$) in the sample chamber 10 and the elapsed time (unit: hr (namely, hour)) when the scanning electron microscope (namely, FIG. 7A) according to an embodiment of the invention of the present application is operated.

The operating current by a homemade power supply was measured using the same vacuum gauge (TiTan 5s ion pump manufactured by Gamma Vacuum) and the conversion table manufactured by Gamma Vacuum, which represents the relation between the ion pump current (unit: nA) and the pressure (unit: Pa), was used to determine the pressure ($P_0$) in the electron source chamber 2 and the pressure ($P_1$) in the intermediate chamber 1. In FIG. 7B, regarding the pressure ($P_0$) in the electron source chamber 2 and the pressure ($P_1$) in the intermediate chamber 1, the measured ion pump current (unit: nA) is shown on the left axis and the main pressure (unit: Pa) obtained from the current using the conversion table is shown on the right axis.

The pressure ($P_2$) in the sample chamber 10 was measured by reading the pressure directly from the DCU (dosing control unit) of the gauge controller using a wide range vacuum gauge (PKR251 manufactured by Pfeiffer Vacuum).

The time points (a) to (d) in FIG. 7B represent the following.

Time point (a): the time point at which the airlock valve 3 is opened.

time point (b): the time point at which the airlock valve 3 is closed, time point (c): the time point at which the sample exchange is completed and the vacuuming of the sample chamber 10 is started, and time point (d): the time point at which the airlock valve 3 is reopened.

The results in FIG. 7B indicate the following.

[1] The time point (a) represents the time point at which the airlock valve 3 is opened. The pressure ($P_2$) in the sample chamber 10 is $10^{-3}$ order, the difference in the degree of vacuum between the pressure ($P_2$) in the sample chamber 10 and the pressure ($P_0$) in the electron source chamber 2 is 3 orders of magnitude or more, and the difference in the degree of vacuum between the pressure ($P_0$) in the electron source chamber 2 and the pressure ($P_1$) in the intermediate chamber 1 is 2 orders of magnitude or less. Therefore, the pressure satisfies the operating exhaust required by the scanning electron microscope (in particular, a scanning electron microscope that uses $LaB_6$ as an emitter of a field-emission electron source).

[2] The period from the time point (a) to the time point (b) represents the period from the opening to the closing of the airlock valve 3. When the airlock valve 3 is opened, the pressure ($P_0$) in the electron source chamber 2 increases sharply once, and thus the degree of vacuum decreases. However, the degree of vacuum does not reach about $3\times10^{-7}$ Pa or more. In short, the degree of vacuum can be maintained at less than about $3\times10^{-7}$ Pa during the above period. This is important. This is because it is generally considered that the upper limit value of the degree of vacuum is required to be set up to $3\times10^{-7}$ Pa in order to stably emit an electron beam when $LaB_6$ is used as an emitter of a field-emission electron source.

Figure 8:
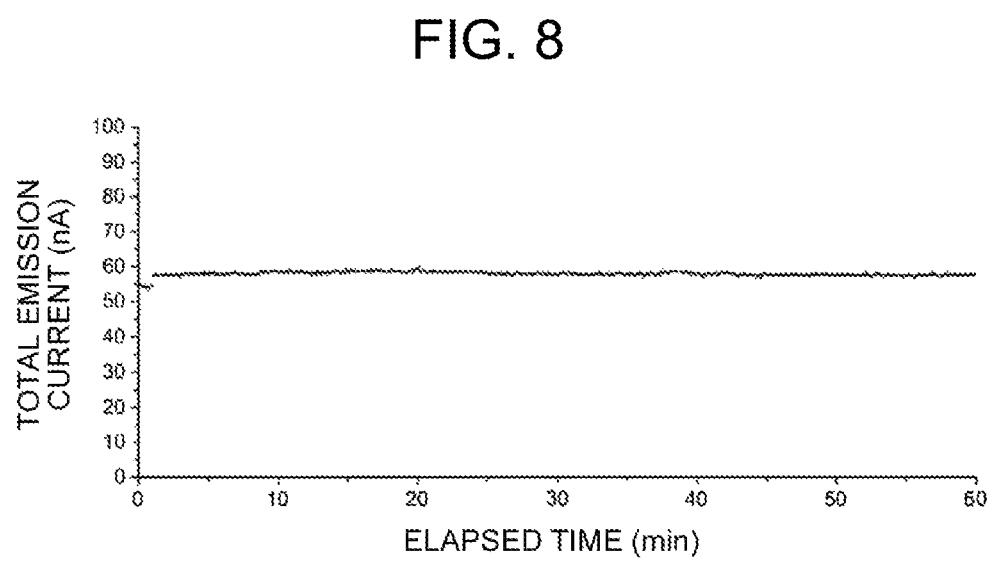

The results in FIG. 7B indicate that the degree of vacuum of less than about $3\times10^{-7}$ Pa can be maintained in a steady state for 2 hours or more during the period, and thus a stable electron beam current may be obtained and sample measurement may be performed stably. FIG. 8 is a graph illustrating the change in the total emission current of the electron source during a part (specifically, 60 minutes) of the period in this steady state, namely, a graph illustrating the total emission profile of a field-emission electron source using $LaB_6$ as an emitter. The conditions are as follows: the airlock valve 3 is in the open state, the pressure ($P_0$) in the electron source chamber 2 is $2.5\times10^{-7}$ Pa, the pressure ($P_1$) in the intermediate chamber 1 is $1\times10^{-3}$ Pa, and the pressure ($P_2$) in the sample chamber 10 is $3\times10^{-3}$ Pa. FIG. 8 indicates that a stable electron beam current, namely, an electron beam is stably obtained.

[3] The time point (b) represents the time point at which the airlock valve 3 is closed, but this indicates the time point at which the airlock valve 3 is closed and the pressure ($P_2$) in the sample chamber 10 is set to the atmospheric pressure for sample exchange. The time point (c) represents the time point at which the sample exchange is completed and the vacuuming of the sample chamber 10 is started. Therefore, in the period from the time point (b) to the time point (c), the pressure ($P_2$) in the sample chamber 10 returns to the atmospheric pressure at the time point (b), but what is important is the following: both the pressure ($P_0$) in the electron source chamber 2 and the pressure ($P_1$) in the intermediate chamber 1 maintain the degree of vacuum at which the electron beam current is obtained even though the degree of vacuum decreases during the above period, in particular, the pressure ($P_0$) in the electron source chamber 2 is a degree of vacuum much lower than $3\times10^{-7}$ Pa. This indicates that there is no leakage through the airlock valve 3.

During the above period, both the pressure ($P_0$) in the electron source chamber 2 and the pressure (P) in the intermediate chamber 1 have immediately recovered from the degree of vacuum that had dropped at the time point (b). At the time point (c), the degrees of vacuum therein have increased to around $7\times10^{-7}$ Pa and around $8\times10^{-8}$ Pa, respectively, and both have returned to good degrees of vacuum.

[4] The time point (c) represents the time point at which the sample exchange is completed and the vacuuming of the sample chamber 10 is started as described above, and the time point (d) represents the time point at which the airlock valve 3 is reopened. Specifically, the above time point (d) is the time point at which the pressure ($P_2$) in the sample chamber 10 is decreased to increase the degree of vacuum up to a region around $1 \times 10^{-3}$ Pa which is less than $1 \times 10^{-2}$ Pa. At this time, the leak valve of the sample chamber 10 is completely closed. What is important is the time between the time point (c) and the time point (d). This time is only 5 minutes, and this indicates that the operating exhaust (namely, a state in which the electron beam current flows) required for sample measurement can be achieved in a short time of 5 minutes. In short, this indicates that the exhaust standby time of the sample chamber 10 after the sample exchange is extremely shortened.

[5] At the time point (d) which represents the time point at which the airlock valve 3 is reopened, the pressure ($P_0$) in the electron source chamber 2, the pressure ($P_1$) in the intermediate chamber 1, and the pressure ($P_2$) in the sample chamber 10 all increase sharply and the degrees of vacuum drop at the time point (d) at which the airlock valve 3 is reopened. However, after the elapse of the above time point (d) which represents the time point at which the airlock valve 3 is reopened, the degrees of vacuum begin to increase immediately and good high degrees of vacuum are achieved. What is important here is that the pressure ($P_0$) in the electron source chamber 2 decreases monotonically while a pressure much lower than $3 \times 10^{-7}$ Pa is maintained. This is because it indicates that a sufficiently good state for the stable emission of electron beam is maintained when $LaB_6$ is used as an emitter of a field-emission electron source, as described above. In short, this indicates that the operating exhaust required by the scanning electron microscope is maintained even when the airlock valve 3 is reopened.

INDUSTRIAL APPLICABILITY

The invention of the present application provides a field-emission electron gun chamber for a scanning electron microscope, and is thus industrially applicable to any field as long as it is a field related to a scanning electron microscope using a field-emission electron source. Among others, the invention of the present application has a structure that is simple and can be miniaturized, and thus is highly expected to be applicable to a field where a field-emission electron source is desired to be used in a scanning electron microscope adopting a maximum acceleration voltage of 15 kV which is widely used.

REFERENCE SIGNS LIST

1 Intermediate chamber
2 Electron source chamber
3 Airlock valve
4 Ion pump for exhausting electron source chamber or ion pump for exhausting intermediate chamber
5 Pipe for vacuum exhaust or vacuum exhaust (rough pumping)
6 Preliminary exhaust valve (roughing valve)
7 Electron microscope lens-barrel
8 Field-emission electron source chamber
9 Vacuum exhaust system
10 Sample chamber
11 Sample stage

The invention claimed is:
1. An electron gun chamber for a scanning electron microscope, the chamber comprising:
(a) an electron source chamber including a site to which a field-emission electron source is detachably attached;
(b) an intermediate chamber, which is provided adjacent to the electron source chamber and through which an electron beam passes in a direction of an electron beam emitted from the electron source installed at the site;
(c) an airlock valve installation portion provided in the intermediate chamber;
(d) an exhaust opening for a pump for preliminary vacuum exhaust, which is provided on each of continuous faces of the electron source chamber and the intermediate chamber; and
(e) an opening and closing means, which is included in the electron source chamber and the intermediate chamber and directly opens and closes the exhaust opening for a pump for preliminary vacuum exhaust,
wherein the electron gun chamber has a substantially cubic shape, and
the electron source chamber and the intermediate chamber are fabricated only by hole drilling of the same stainless steel block, which does not require welding.

2. The electron gun chamber according to claim 1, wherein the opening and closing means has a configuration in which a lid body interlocked with sliding of a piston is pressed and released to open and close each of the exhaust openings of the electron source chamber and the intermediate chamber.

3. The electron gun chamber according to claim 2, wherein
the exhaust opening of the electron source chamber is placed on a bottom face of a cylindrical concave provided on a side face of the electron source chamber, wherein the concave is fitted into the lid body that opens and closes the exhaust opening of the electron source chamber, and
the exhaust opening of the intermediate chamber is placed on a bottom face of a cylindrical concave portion provided on a side face of the intermediate chamber, wherein the concave portion is fitted into the lid body that opens and closes the exhaust opening of the intermediate chamber.

4. The electron gun chamber according to claim 2, wherein the lid body that opens and closes the exhaust opening of the electron source chamber and the lid body that opens and closes the exhaust opening of the intermediate chamber are the same one lid body.

5. The electron gun chamber according to claim 4, wherein both the exhaust openings of the electron source chamber and the intermediate chamber continue from the electron source chamber and the intermediate chamber and are placed on a bottom face of one cylindrical concave portion provided on a side face straddling the electron source chamber and the intermediate chamber, and wherein the concave portion is fitted into the lid body.

6. The electron gun chamber according to claim 1, wherein each of the electron source chamber and the intermediate chamber comprises an exhaust opening for a pump for high vacuum exhaust, the pump for high vacuum exhaust performing exhaust to a degree of vacuum at which a field-emission electron source operates.

7. The electron gun chamber according to claim 6, wherein the exhaust openings for a pump for high vacuum exhaust of the electron source chamber and the intermediate chamber are placed at positions at which the exhaust openings are symmetrical to each other.

8. An electron gun chamber for a scanning electron microscope having a substantially cubic shape, the electron gun chamber comprising:
(a) an electron source chamber including a site to which a field-emission electron source is detachably attached;

(b) a first intermediate chamber provided adjacent to the electron source chamber and a second intermediate chamber adjacent to a lower region of the first intermediate chamber, through which an electron beam passes below the electron source in a direction of an electron beam emitted from the electron source installed at the site; and (c') an airlock valve installed in the second intermediate chamber, wherein the airlock valve is equipped with:

(i) an O-ring installation face having an inclination axis of 60° or more and 80° or less with respect to an adjacent face of the first intermediate chamber and the second intermediate chamber, and (ii) a substantially cylindrical convex portion extending upward in a direction perpendicular to the inclination axis on the O-ring installation face, wherein the convex portion comprises a means for passing and blocking the electron beam, wherein:

the means for passing an electron beam has a configuration in which an electron beam passes through a through hole of the convex portion provided in a direction of the electron beam passing through the second intermediate chamber, and the means for blocking an electron beam has a configuration in which the convex portion is slid in a direction perpendicular to the inclination axis to shift the through hole and block passage of an electron beam.

9. The electron gun chamber according to claim 8, wherein the airlock valve includes a means for shielding an electron beam at a site exposed to the electron beam of the O-ring installation face.

10. An electron gun for a scanning electron microscope, comprising the electron gun chamber according to claim 1.

11. A scanning electron microscope comprising the electron gun chamber according to claim 1.

12. The electron gun chamber according to claim 1, wherein the opening and closing means directly covers the exhaust openings thereby sealing the exhaust opening.

13. The electron gun chamber according to claim 8, wherein airlock valve comprises a drive unit installed on an outside of the intermediate chamber.

* * * * *